United States Patent
Kim et al.

(10) Patent No.: US 12,170,298 B2
(45) Date of Patent: Dec. 17, 2024

(54) IMAGE SENSOR INCLUDING A PHOTODIODE

(71) Applicant: SAMSUNG ELECTRONICS CO., LTD., Suwon-si (KR)

(72) Inventors: Jameyung Kim, Seoul (KR); Sungin Kim, Hwaseong-si (KR); Dongmo Im, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 416 days.

(21) Appl. No.: 17/562,125

(22) Filed: Dec. 27, 2021

(65) Prior Publication Data

US 2022/0208817 A1 Jun. 30, 2022

(30) Foreign Application Priority Data

Dec. 28, 2020 (KR) .................. 10-2020-0185210

(51) Int. Cl.
*H01L 27/14* (2006.01)
*H01L 27/146* (2006.01)

(52) U.S. Cl.
CPC .. *H01L 27/14614* (2013.01); *H01L 27/14621* (2013.01); *H01L 27/14627* (2013.01); *H01L 27/1463* (2013.01); *H01L 27/1464* (2013.01); *H01L 27/14645* (2013.01); *H01L 27/14689* (2013.01)

(58) Field of Classification Search
CPC ......... H01L 27/14601; H01L 27/14603; H01L 27/14614; H01L 27/1463; H01L 27/14638
See application file for complete search history.

(56) References Cited

U.S. PATENT DOCUMENTS

| | | | |
|---|---|---|---|
| 8,564,701 B2 | 10/2013 | Watanabe et al. | |
| 9,337,224 B2 | 5/2016 | Ihara | |
| 9,356,067 B2 | 5/2016 | Shin | |
| 9,806,113 B2 | 10/2017 | Oh et al. | |
| 9,831,279 B2 | 11/2017 | Jin et al. | |
| 10,153,311 B2 | 12/2018 | Adachi et al. | |
| 10,388,682 B2 | 8/2019 | Jin | |
| 11,843,019 B2 * | 12/2023 | Zang | H01L 27/14614 |
| 2018/0061875 A1 | 3/2018 | Roy | |

FOREIGN PATENT DOCUMENTS

| KR | 10-2005-0013397 | 2/2005 |
|---|---|---|
| KR | 10-2006-0077244 | 7/2006 |
| KR | 10-2087233 | 3/2020 |

* cited by examiner

*Primary Examiner* — Kevin K Pyo
(74) *Attorney, Agent, or Firm* — F. CHAU & ASSOCIATES, LLC

(57) ABSTRACT

An image sensor includes: a semiconductor substrate including a first surface and a second surface opposite to each other; a buried transfer gate electrode arranged in a transfer gate trench extending from the first surface of the semiconductor substrate into the semiconductor substrate, wherein the buried transfer gate electrode has an upper surface arranged at a level lower than that of the first surface of the semiconductor substrate with respect to the second surface of the semiconductor substrate; and a transfer gate spacer arranged on an upper sidewall of the transfer gate trench and on the buried transfer gate electrode.

20 Claims, 30 Drawing Sheets

A2-A2'

IMAGE SENSOR INCLUDING A PHOTODIODE

CROSS-REFERENCE TO RELATED APPLICATION

This application claims priority under 35 U.S.C. § 119 to Korean Patent Application No. 10-2020-0185210, filed on Dec. 28, 2020, in the Korean Intellectual Property Office, the disclosure of which is incorporated by reference herein in its entirety.

TECHNICAL FIELD

The present inventive concept relates to an image sensor, more particularly, to an image sensor including a photodiode.

DISCUSSION OF THE RELATED ART

Image sensors convert optical image signals into electrical signals. The image sensors typically include a plurality of pixels, and each of the plurality of pixels includes a photodiode region and a pixel circuit. The photodiode region receives incident light and converts the incident light into an electric signal, and the pixel circuit outputs a pixel signal by using charges generated in the photodiode region. As the degree of integration of an image sensor increases, the size of each pixel decreases and the size of each component of the pixel circuit also decreases. Accordingly, the quality of the image sensor may deteriorate due to leakage current through the pixel circuit.

SUMMARY

According to an exemplary embodiment of the present inventive concept, an image sensor includes: a semiconductor substrate including a first surface and a second surface opposite to each other; a buried transfer gate electrode arranged in a transfer gate trench extending from the first surface of the semiconductor substrate into the semiconductor substrate, wherein the buried transfer gate electrode has an upper surface arranged at a level lower than that of the first surface of the semiconductor substrate with respect to the second surface of the semiconductor substrate; and a transfer gate spacer arranged on an upper sidewall of the transfer gate trench and on the buried transfer gate electrode.

According to an exemplary embodiment of the present inventive concept, an image sensor includes: a semiconductor substrate including a first surface and a second surface opposite to each other; an isolation layer provided on the first surface of the semiconductor substrate and defining an active region; a buried transfer gate electrode arranged in a transfer gate trench extending from the first surface of the semiconductor substrate toward the second surface of the semiconductor substrate; a transfer gate spacer arranged on an upper sidewall of the transfer gate trench and on the buried transfer gate electrode; a buried insulating layer arranged on the first surface of the semiconductor substrate, the transfer gate spacer, and the buried transfer gate electrode, and filling an upper portion of the transfer gate trench; and a first contact passing through the buried insulating layer, and connected to the buried transfer gate electrode.

According to an exemplary embodiment of the present inventive concept, an image sensor includes: a first chip and a second chip attached to the first chip, wherein the first chip includes: a semiconductor substrate including a first surface and a second surface opposite to each other; an isolation layer provided on the first surface of the semiconductor substrate and defining an active region; a buried transfer gate electrode arranged in a transfer gate trench extending into the semiconductor substrate; a transfer gate spacer arranged on a first sidewall of the transfer gate trench and on the buried transfer gate electrode; a first gate electrode arranged on the first surface of the semiconductor substrate; a gate spacer arranged on a sidewall of the first gate electrode; a buried insulating layer arranged on the first surface of the semiconductor substrate, the first gate electrode, and the buried transfer gate electrode, and filling a portion of the transfer gate trench; an interlayer insulating layer arranged on the buried insulating layer; a first contact passing through the buried insulating layer and the interlayer insulating layer, and connected to the buried transfer gate electrode; and a second contact passing through the buried insulating layer and the interlayer insulating layer, and connected to the first gate electrode.

BRIEF DESCRIPTION OF THE DRAWINGS

The above and other aspects of the present inventive concept will become more apparent by describing in detail embodiments thereof, with reference to the accompanying drawings, in which.

DETAILED DESCRIPTION OF THE EMBODIMENTS

Hereinafter, exemplary embodiments of the present inventive concept will be described in detail with reference to the accompanying drawings.

Figure 1:
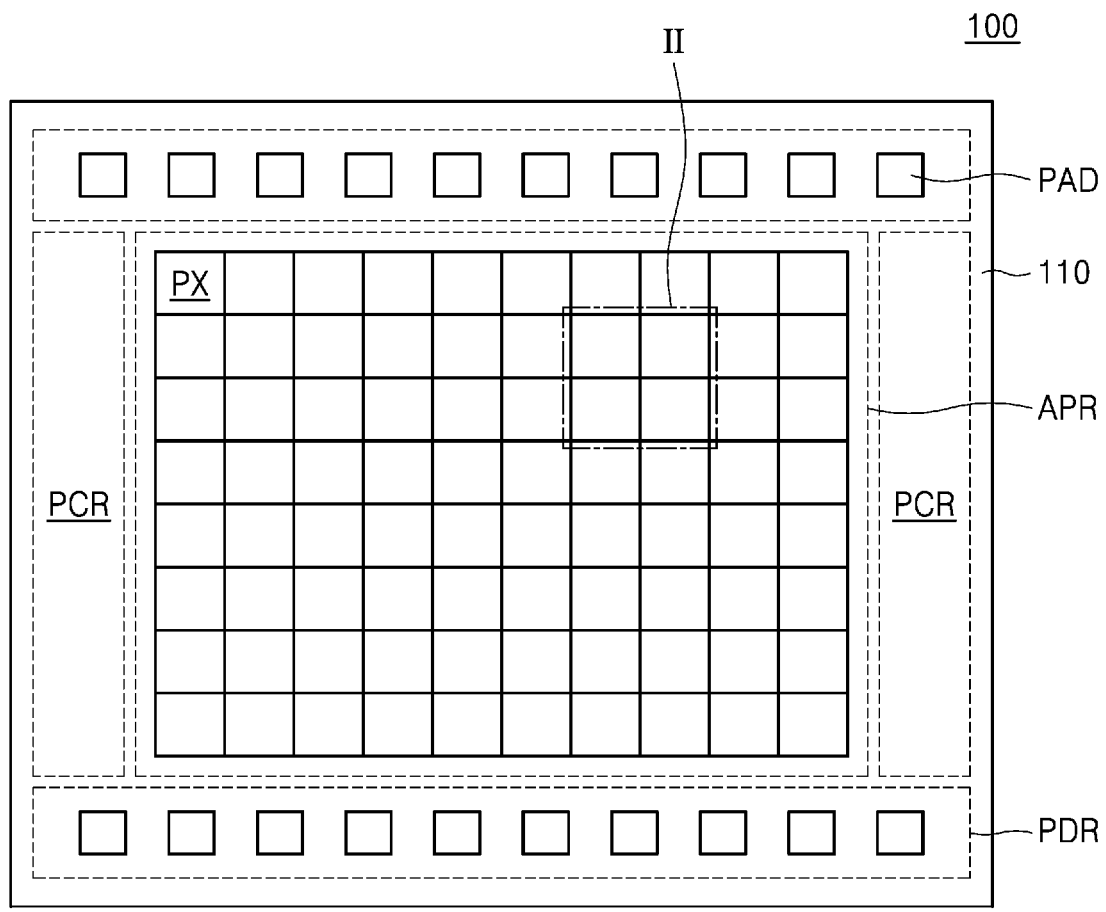
FIG. 1 is a layout diagram of an image sensor according to an exemplary embodiment of the present inventive concept.
Figure 2:
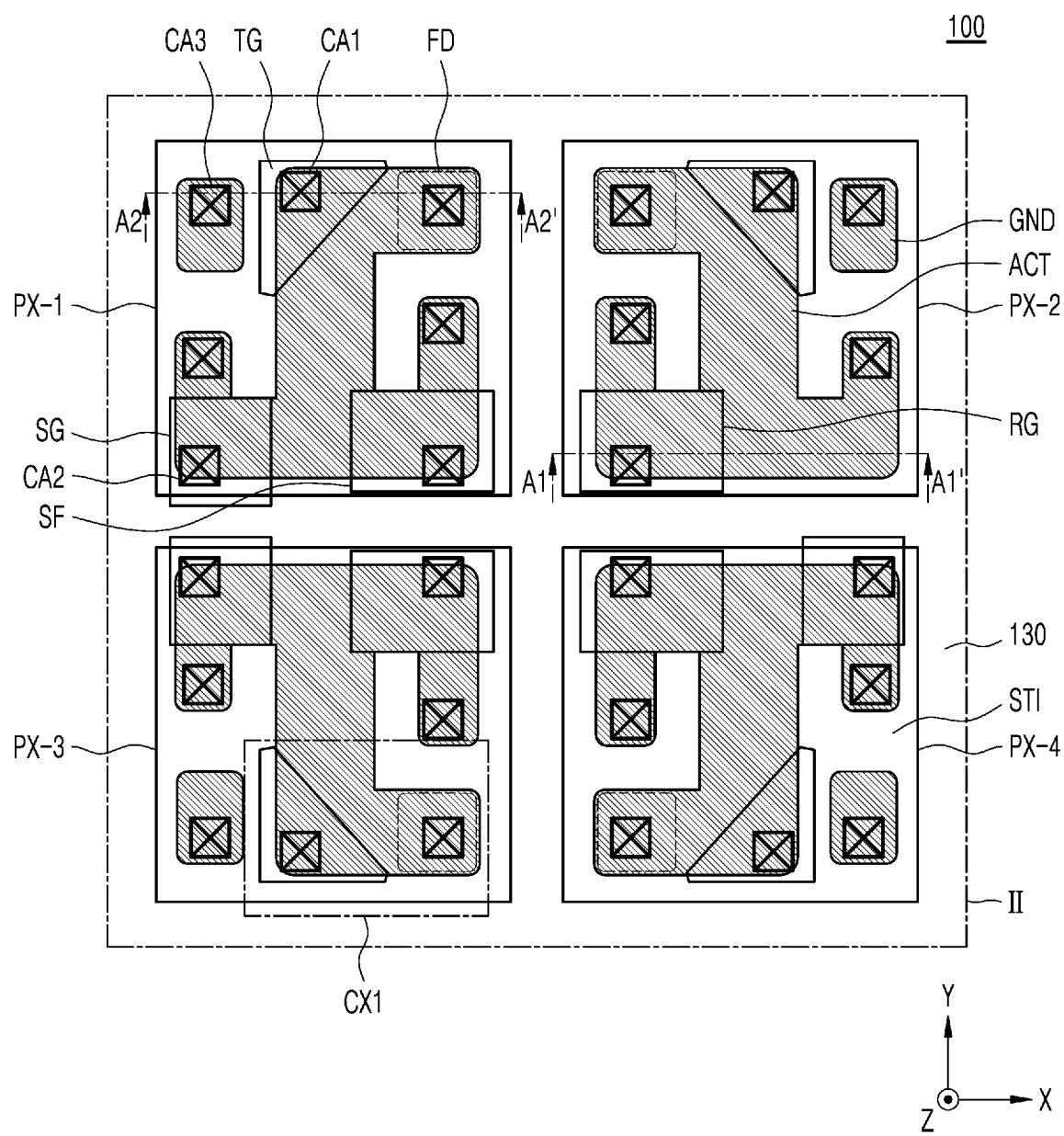
FIG. 2 is an enlarged layout of a region II of FIG. 1.
Figure 3:
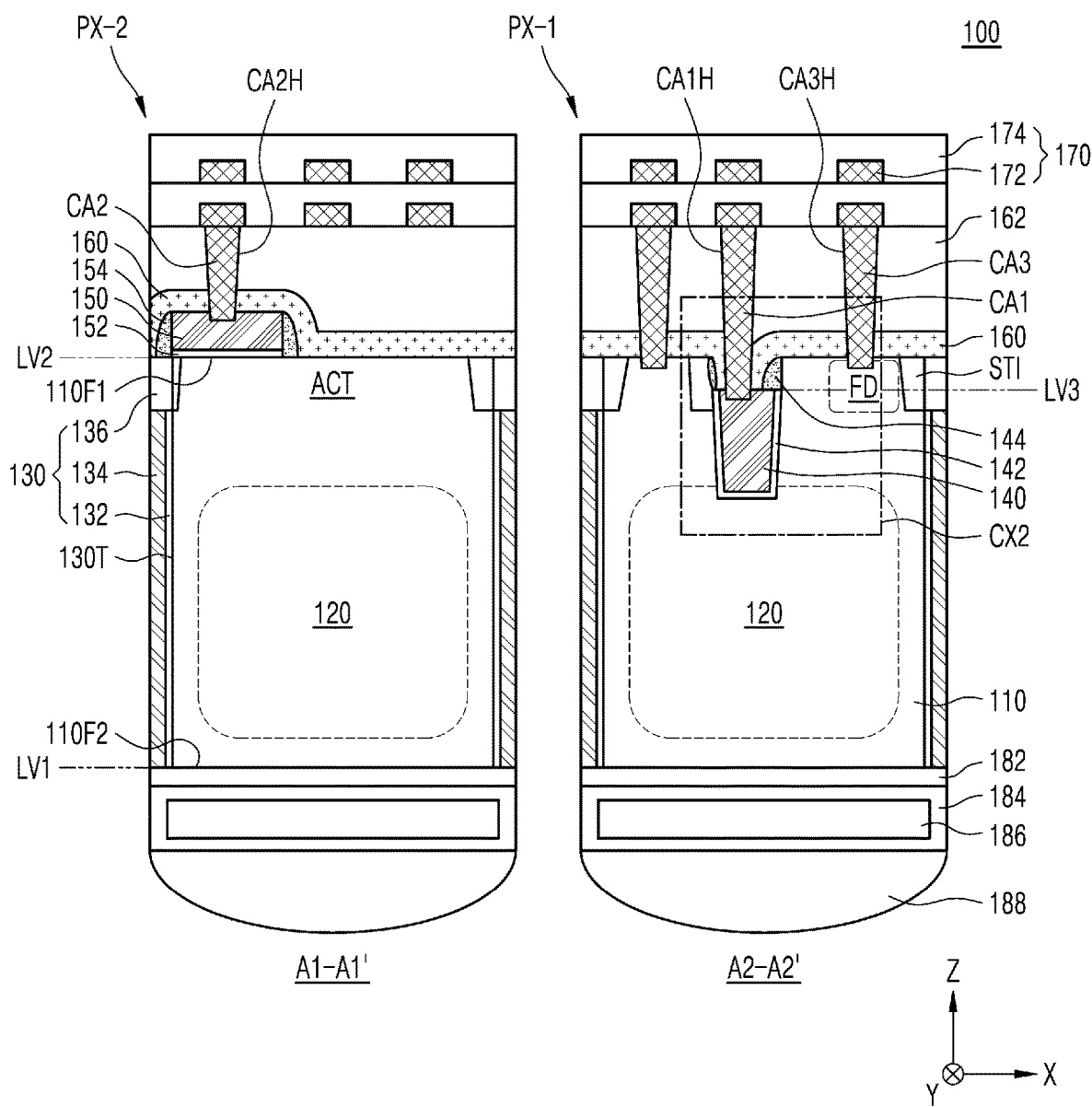
FIG. 3 is a cross-sectional view taken along line A1-A1' and line A2-A2' of FIG. 2.
Figure 4:
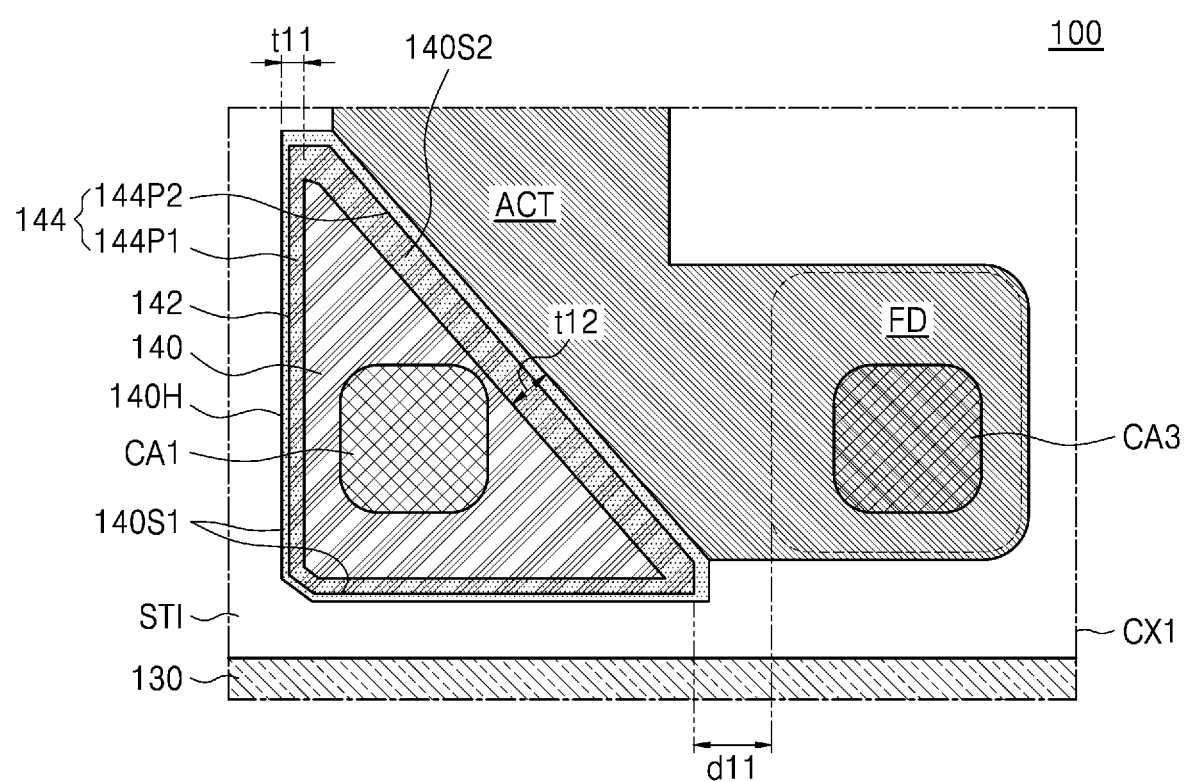
FIG. 4 is an enlarged view of a region CX1 of FIG. 2.
Figure 5:
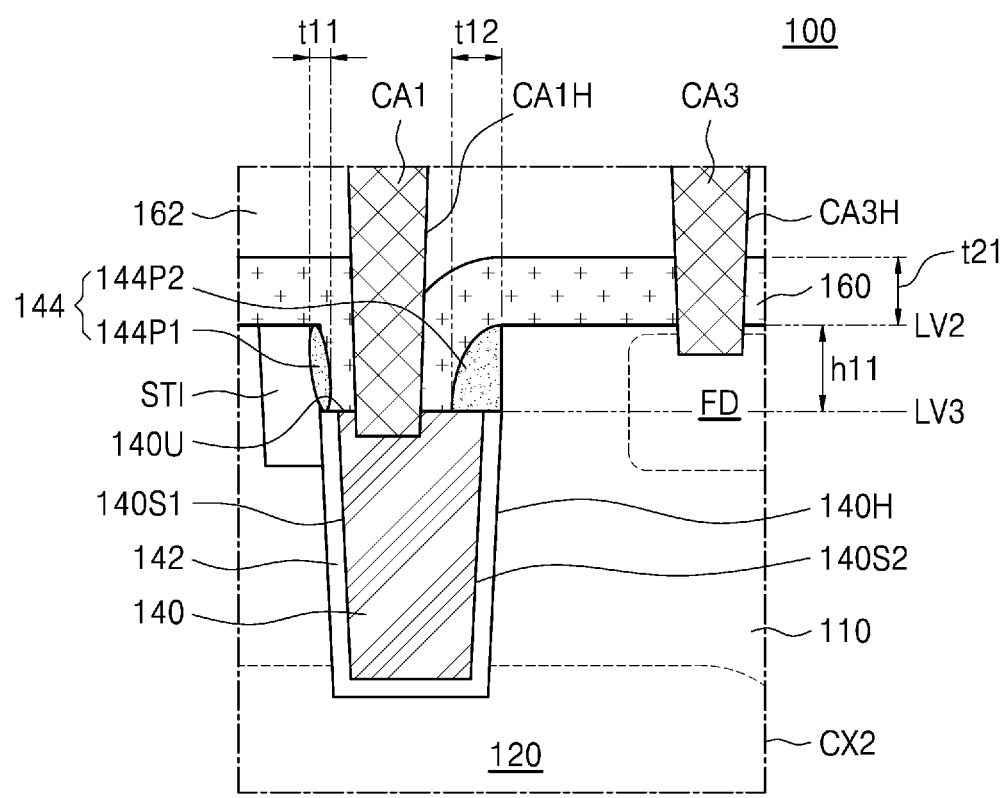
FIG. 5 is an enlarged view of a region CX2 of FIG. 3.

FIG. 1 is a layout diagram of an image sensor 100 according to an exemplary embodiment of the present inventive concept. FIG. 2 is an enlarged layout of a region II of FIG. 1. FIG. 3 is a cross-sectional view taken along line A1-A1' and line A2-A2' of FIG. 2. FIG. 4 is an enlarged view of a region CX1 of FIG. 2. FIG. 5 is an enlarged view of a region CX2 of FIG. 3. FIGS. 1, 2, and 5 illustrate only a partial configuration of the image sensor 100 for convenience.

Referring to FIGS. 1 to 5, the image sensor 100 may include an active pixel region APR, a peripheral circuit region PCR, and a pad region PDR, which are formed on a semiconductor substrate 110.

The active pixel region APR may be arranged in a central region of the semiconductor substrate 110, and the peripheral circuit region PCR may be arranged on two sides of the active pixel region APR. The pad region PDR may be arranged at an edge portion of the semiconductor substrate 110. For example, the pad region PDR may be arranged between the edge portion of the semiconductor substrate 110 and a side of the active pixel region APR.

The active pixel region APR may include a plurality of pixels PX, and a plurality of photoelectric conversion regions 120 may be respectively arranged in the plurality of pixels PX. In the active pixel region APR, the plurality of pixels PX may be arranged in a matrix form while forming columns and rows in a first direction X, which is parallel to an upper surface of the semiconductor substrate 110, and a second direction Y, which is perpendicular to the first direction X and parallel to the upper surface of the semiconductor substrate 110.

The peripheral circuit region PCR is illustrated as being arranged on two sides of the active pixel region APR in a plan view, but the present inventive concept is not limited thereto and may be arranged to, for example, entirely surround the active pixel region APR. A conductive pad PAD may be arranged in the pad region PDR. The conductive pad PAD may be arranged on an edge portion of the semiconductor substrate 110.

The semiconductor substrate 110 may include a first surface 110F1 and a second surface 110F2, which are opposite to each other. In this case, for convenience of description, a surface of the semiconductor substrate 110, on which a color filter 186 is arranged, is referred to as the second surface 110F2, and a surface opposite to the second surface 110F2 is referred to as the first surface 110F1. However, the present inventive concept is not limited thereto.

In an exemplary embodiment of the present inventive concept, the semiconductor substrate 110 may include a P-type semiconductor substrate. For example, the semiconductor substrate 110 may include a P-type silicon substrate. In an exemplary embodiment of the present inventive concept, the semiconductor substrate 110 may include a P-type bulk substrate and a P-type or N-type epitaxial layer grown thereon. In an exemplary embodiment of the present inventive concept, the semiconductor substrate 110 may include an N-type bulk substrate and a P-type or N-type epitaxial layer grown thereon. In addition, the semiconductor substrate 110 may include an organic plastic substrate.

In the active pixel region APR, the plurality of pixels PX may be arranged in a matrix form in the semiconductor substrate 110. The plurality of photoelectric conversion regions 120 may be respectively arranged in the plurality of pixels PX. Each of the plurality of photoelectric conversion regions 120 may include a photodiode region and a well region.

In the active pixel region APR, a pixel isolation layer 130 may be arranged in the semiconductor substrate 110 and the plurality of pixels PX may be defined by the pixel isolation layer 130. The pixel isolation layer 130 may be arranged between one of the plurality of photoelectric conversion regions 120 and a photoelectric conversion region 120 adjacent thereto. One photoelectric conversion region 120 and another photoelectric conversion region 120 adjacent thereto may be physically and electrically separated from each other by the pixel isolation layer 130. The pixel isolation layer 130 may be arranged between two adjacent ones of the plurality of photoelectric conversion regions 120 arranged in a matrix form, and may have a grid or mesh shape in a plan view.

The pixel isolation layer 130 may be formed in a pixel trench 130T passing through the semiconductor substrate 110 and may be between the first surface 110F1 to the second surface 110F2 of the semiconductor substrate 110. The pixel isolation layer 130 may include an insulating layer 132 conformally formed on a sidewall of the pixel trench 130T, and a conductive layer 134 filling the inside of the pixel trench 130T on the insulating layer 132. In an exemplary embodiment of the present inventive concept, the insulating layer 132 may include a metal oxide such as hafnium oxide, aluminum oxide, or tantalum oxide. In this case, the insulating layer 132 may function as a negative fixed charge layer. However, the present inventive concept is not limited thereto. In an exemplary embodiment of the present inventive concept, the insulating layer 132 may include an insulating material such as silicon oxide, silicon nitride, or silicon oxynitride. The conductive layer 134 may include at least one of a doped polysilicon, a metal, a metal silicide, a metal nitride, and/or a metal-containing layer.

In an exemplary embodiment of the present inventive concept, an upper insulating layer 136 may be arranged in a portion of the pixel trench 130T adjacent to the first surface 110F1 of the semiconductor substrate 110. In an exemplary embodiment of the present inventive concept, the upper insulating layer 136 may be formed by etching the insulating layer 132 and the conductive layer 134, which are each arranged at the entrance of the pixel trench 130T, and filling a remaining space, where the insulating layer 132 and the conductive layer 134 were removed from, with an insulating material.

FIG. 3 illustrates that the pixel isolation layer 130 extends through the semiconductor substrate 110 from the first surface 110F1 to the second surface 110F2 of the semiconductor substrate 110. However, the pixel isolation layer 130 may extend from the second surface 110F2 of the semiconductor substrate 110 toward the inside of the semiconductor substrate 110 and may not be exposed at the first surface 110F1 of the semiconductor substrate 110.

As illustrated in FIG. 3, an isolation layer STI defining an active region ACT and a ground region GND may be formed on the first surface 110F1 of the semiconductor substrate 110. The isolation layer STI may be arranged in an isolation trench 110T (refer to FIG. 13) formed to a predetermined depth from the first surface 110F1 of the semiconductor substrate 110 and may include an insulating material. The isolation layer STI may at least partially surround an upper sidewall (e.g., a sidewall of the upper insulating layer 136) of the pixel isolation layer 130.

Transistors constituting a pixel circuit may be arranged on the active region ACT. For example, the active region ACT may be a portion of the semiconductor substrate 110 on which a transfer gate TG, a source follower gate SF, a selection gate SG, and a reset gate RG are arranged. A floating diffusion region FD may be arranged in a portion of the active region ACT, for example, in a portion of the active region ACT adjacent to the transfer gate TG.

In an exemplary embodiment of the present inventive concept, a first pixel PX-1, a second pixel PX-2, a third pixel PX-3, and a fourth pixel PX-4 may be arranged in a matrix form, as shown in FIG. 2. The first pixel PX-1 and the third pixel PX-3 arranged side by side in the second direction Y may have mirror symmetry with each other, and the first pixel PX-1 and the second pixel PX-2 arranged side by side in the first direction X may have mirror symmetry with each other. In addition, the second pixel PX-2 may include a transfer gate TG and a reset gate RG, and the first pixel PX-1, the third pixel PX-3, and the fourth pixel PX-4 may each include a transfer gate TG, a source follower gate SF, and a selection gate SG. However, the layout illustrated in FIG. 2 corresponds to the layout of transistors according to an exemplary embodiment of the present inventive concept, and the layout of the transistors or the shape of the active region ACT is not limited thereto.

In an exemplary embodiment of the present inventive concept, the transfer gate TG may constitute a transfer transistor TX (refer to FIG. 6), and the transfer transistor TX may be configured to transfer charges generated in the photoelectric conversion region 120 to the floating diffusion region FD. The reset gate RG may constitute a reset transistor RX (refer to FIG. 6), and the reset transistor RX may be configured to periodically reset charges stored in the floating diffusion region FD. The source follower gate SF may constitute a drive transistor DX (refer to FIG. 6), and the drive transistor DX may be configured to function as a source follower buffer amplifier and buffer a signal according to charges charged in the floating diffusion region FD. The selection gate SG may constitute a selection transistor SX (refer to FIG. 6), and the selection transistor SX may perform switching and addressing functions for selecting the pixel PX.

As illustrated in FIG. 3, the transfer gate TG may be referred to as a buried transfer gate electrode 140, and the buried transfer gate electrode 140 may be arranged in a transfer gate trench 140H extending from the first surface 110F1 of the semiconductor substrate 110 into the inside of the semiconductor substrate 110. The reset gate RG, the source follower gate SF, and the selection gate SG may be referred to as a first gate electrode 150, and the first gate electrode 150 may be arranged on the first surface 110F1 of the semiconductor substrate 110. In an exemplary embodiment of the present inventive concept, the buried transfer gate electrode 140 and the first gate electrode 150 may each include at least one of a doped polysilicon, a metal, a metal silicide, a metal nitride, and/or a metal-containing layer.

The buried transfer gate electrode 140 may fill the inside of the transfer gate trench 140H, and an upper surface 140U of the buried transfer gate electrode 140 may be arranged at a level lower than that of the first surface 110F1 of the semiconductor substrate 110. For example, when the second surface 110F2 of the semiconductor substrate 110 is arranged at a first vertical level LV1 and the first surface 110F1 of the semiconductor substrate 110 is arranged at a second vertical level LV2, the upper surface 140U of the buried transfer gate electrode 140 may be arranged at a third vertical level LV3 that is lower than the second vertical level LV2. The upper surface 140U of the buried transfer gate electrode 140 may have a first depth h11 from the first surface 110F1 of the semiconductor substrate 110, and the first depth h11 may be in the range of about 5 nm to about 200 nm.

The buried transfer gate insulating layer 142 may be arranged on an inner wall of the transfer gate trench 140H to at least partially surround sidewalk and a bottom surface of the buried transfer gate electrode 140. Although FIG. 5 illustrates that an upper surface of the buried transfer gate insulating layer 142 is arranged at the same level as the upper surface 140U of the buried transfer gate electrode 140 and that the buried transfer gate insulating layer 142 does not extend to the upper side of the transfer gate trench 140H, the present inventive concept is not limited thereto. In an exemplary embodiment of the present inventive concept, as shown in FIG. 5, the buried transfer gate insulating layer 142 may extend to the upper side of the transfer gate trench 140H and may have an upper surface arranged at a higher level than the upper surface 140U of the buried transfer gate electrode 140.

A transfer gate spacer 144 may be arranged on an upper sidewall of the transfer gate trench 140H. An upper surface of the transfer gate spacer 144 may be arranged at the same level as the first surface 110F1 of the semiconductor substrate 110, and a bottom surface of the transfer gate spacer 144 may be arranged on the upper surface 140U of the buried transfer gate electrode 140. For example, the uppermost surface or uppermost point of the transfer gate spacer 144 may be arranged at the same level as the first surface 110F1. For example, the transfer gate spacer 144 may be disposed between the first surface 110F1 and the buried transfer gate electrode 140. Although FIG. 5 illustrates that the bottom surface of the transfer gate spacer 144 is in contact with the upper surface 140U of the buried transfer gate electrode 140, the present inventive concept is not limited thereto. In an exemplary embodiment of the present inventive concept, the upper surface 140U of the buried transfer gate electrode 140 may be covered by an insulating liner and the transfer gate spacer 144 may be arranged on the insulating liner, and thus, the bottom surface of the transfer gate spacer 144 may not contact the upper surface 140U of the buried transfer gate electrode 140.

In an exemplary embodiment of the present inventive concept, as shown in FIGS. 4 and 5, the buried transfer gate electrode 140 may include a first sidewall 140S1 and a second sidewall 140S2. The first sidewall 140S1 of the buried transfer gate electrode 140 may be at least partially surrounded by the isolation layer ST1, and the second sidewall 140S2 may be at least partially surrounded by the active region ACT. The second sidewall 140S2 may be arranged adjacent to the floating diffusion region FD. For example, the second sidewall 140S2 may be arranged apart from the floating diffusion region FD by a first distance d11. The first distance d11 may be in the range of about 5 nm to about 100 nm.

In an exemplary embodiment of the present inventive concept, with respect to the second snake 110F2 of the semiconductor substrate 110, the upper surface 140U of the buried transfer gate electrode 140 may be arranged at a lower level than an upper surface of the floating diffusion region FD. In addition, the buried transfer gate electrode 140 may have an upper surface 140U that is substantially flat over the entire area thereof. Therefore, even though the first distance d11 is reduced due to the integration of the image sensor 100, the movement path of charges between the buried transfer gate electrode 140 and the floating diffusion region FD may be relatively long, and accordingly, parasitic capacitance between the buried transfer gate electrode 140 and the floating diffusion region FD may be reduced or gate induced drain leakage (GIDL) current caused by the buried transfer gate electrode 140 may be prevented.

The transfer gate spacer 144 may include a first portion 144P1, and a second portion 144P2. For example, the first portion 144P1 may be arranged on the first sidewall 140S1 of the buried transfer gate electrode 140, and the second portion 144P2 may be arranged on the second sidewall 140S2 of the buried transfer gate electrode 140. For example, the first portion 144P1 may be disposed above the first sidewall 140S1, and the second portion 144P2 may be disposed above the second sidewall 140S2. For example, the first portion 144P1 may have a first thickness t11, and the second portion 144P2 may have a second thickness t12 that is greater than the first thickness t11. For example, the first thickness t11 may be about 5 nm to about 100 nm, and the second thickness t12 may be about 10 nm to about 200 nm. However, the present inventive concept is not limited thereto. The transfer gate spacer 144 may include silicon nitride or silicon oxynitride.

The first gate electrode 150 may be arranged on the first surface 110F1 of the semiconductor substrate 110. A gate insulating layer 152 may be arranged between the first surface 110F1 of the semiconductor substrate 110 and the first gate electrode 150, and a gate spacer 154 may be arranged on a sidewall of the first gate electrode 150. The gate spacer 154 may include the same material as the material of the transfer gate spacer 144.

A buried insulating layer 160 may be arranged on the first surface 110F1 of the semiconductor substrate 110. The buried insulating layer 160 may cover the active region ACT, the isolation layer STI, an upper surface of the first gate electrode 150, and the gate spacer 154, and may be arranged to fill an upper portion of the transfer gate trench 140H (e.g., the entrance of the transfer gate trench 140H adjacent to the first surface 110F1). The buried insulating layer 160 may be formed to have a thickness sufficient to cover the transfer gate spacer 144 and an upper surface of the buried transfer gate electrode 140 and fill the upper portion of the transfer gate trench 140H. For example, the buried insulating layer 160 may have a third thickness t21 in a direction perpendicular to the first surface 110F1 of the semiconductor substrate 110. For example, the third thickness t21 may be in the range of about 5 nm to about 100 nm.

In an exemplary embodiment of the present inventive concept, the buried insulating layer 160 may include silicon nitride and silicon oxynitride. For example, the buried insulating layer 160 may have a stacked structure of a first insulating layer and a second insulating layer, and the density of the first insulating layer may be different from the density of the second insulating layer. In another example, the buried insulating layer 160 may have a stacked structure of a first insulating layer and a second insulating layer, and the content of nitrogen in the first insulating layer may be different from the content of nitrogen in the second insulating layer. In an additional example, an etch stop layer may be between the buried insulating layer 160 and the first surface 110F1 of the semiconductor substrate 110, and the etch stop layer may include a material having an etch selectivity with respect to the buried insulating layer 160.

An interlayer insulating layer 162 may be arranged on the buried insulating layer 160. A first contact CA1 connected to the buried transfer gate electrode 140 may be arranged in a first contact hole CA1H passing through the interlayer insulating layer 162 and the buried insulating layer 160. A second contact CA2 connected to the first gate electrode 150 may be arranged in a second contact hole CA2H passing through the interlayer insulating layer 162 and the buried insulating layer 160. A third contact CA3 connected to the ground region GND or the active region ACT may be arranged in a third contact hole CA3H passing through the interlayer insulating layer 162 and the buried insulating layer 160. A bottom surface of the first contact CA1 may extend to a vertical level lower than a bottom surface of the second contact CA2 and a bottom surface of the third contact CA3.

An upper wiring structure 170 may be arranged on the interlayer insulating layer 162. The upper wiring structure 170 may have a stacked structure of a plurality of layers. The upper wiring structure 170 may include a wiring layer 172 and an insulating layer 174 surrounding the wiring layer 172. The wiring layer 172 may include at least one of polysilicon doped or not doped with impurities, a metal, a metal silicide, a metal nitride, and/or a metal-containing layer. For example, the wiring layer 172 may include tungsten, aluminum, copper, tungsten silicide, titanium silicide, tungsten nitride, titanium nitride, doped polysilicon, or the like. The insulating layer 174 may include an insulating material such as silicon oxide, silicon nitride, or silicon oxynitride.

A rear insulating layer 182 may be arranged on the second surface 110F2 of the semiconductor substrate 110. The rear insulating layer 182 may be arranged on substantially the entire area of the second surface 110F2 of the semiconductor substrate 110, and the rear insulating layer 182 may contact the pixel isolation layer 130. For example, the rear insulating layer 182 may contact an upper surface of the pixel isolation layer 130 arranged at substantially the same level as the second surface 110F2 of the semiconductor substrate 110. In an exemplary embodiment of the present inventive concept, the rear insulating layer 182 may include a metal oxide such as hafnium oxide, aluminum oxide, or tantalum oxide. In an exemplary embodiment of the present inventive concept, the rear insulating layer 182 may include an insulating material such as silicon oxide, silicon nitride, silicon oxynitride, or a low-k dielectric material.

A passivation layer 184 may be arranged on the rear insulating layer 182, and a color filter 186 and a microlens 188 may be arranged on the passivation layer 184. For example, a support substrate may be arranged on the first surface 110F1 of the semiconductor substrate 110.

According to a comparative example, the transfer gate TG has a recess gate shape, in which an upper portion of the transfer gate TG is arranged at a higher level than the first surface 110F1 of the semiconductor substrate 110 and the lower side of the transfer gate TG extends into the inside of the semiconductor substrate 110. In particular, the transfer gate TG and other gates (e.g., the reset gate RG, the selection gate SG, and the source follower gate SF) may be patterned using the same mask pattern, and in the patterning process, a protrusion such as a stringer may remain on a sidewall of the transfer gate TG. As the integration of the image sensor 100 increases, a vertical distance between the transmission gate TG and the floating diffusion region FD adjacent thereto may decrease, and a parasitic capacitance between the protrusion of the transfer gate TG and the floating diffusion region FD may increase or a GIDL current may increase, and thus, image quality deterioration factors such as white spots may occur.

However, according to an exemplary embodiment of the present inventive concept, the transfer gate TG may include the buried transfer gate electrode 140 and an upper portion of the buried transfer gate electrode 140 may be removed by an etch-back process after the first gate electrode 150 is formed, and thus, the buried transfer gate electrode 140 may have a flat upper surface 140U arranged at a lower level than the first surface 110F1 of the semiconductor substrate 110.

Accordingly, an increase in parasitic capacitance due to the protrusion, or generation of a GIDL current may be prevented, and the image sensor 100 may have increased image quality.

Figure 6:
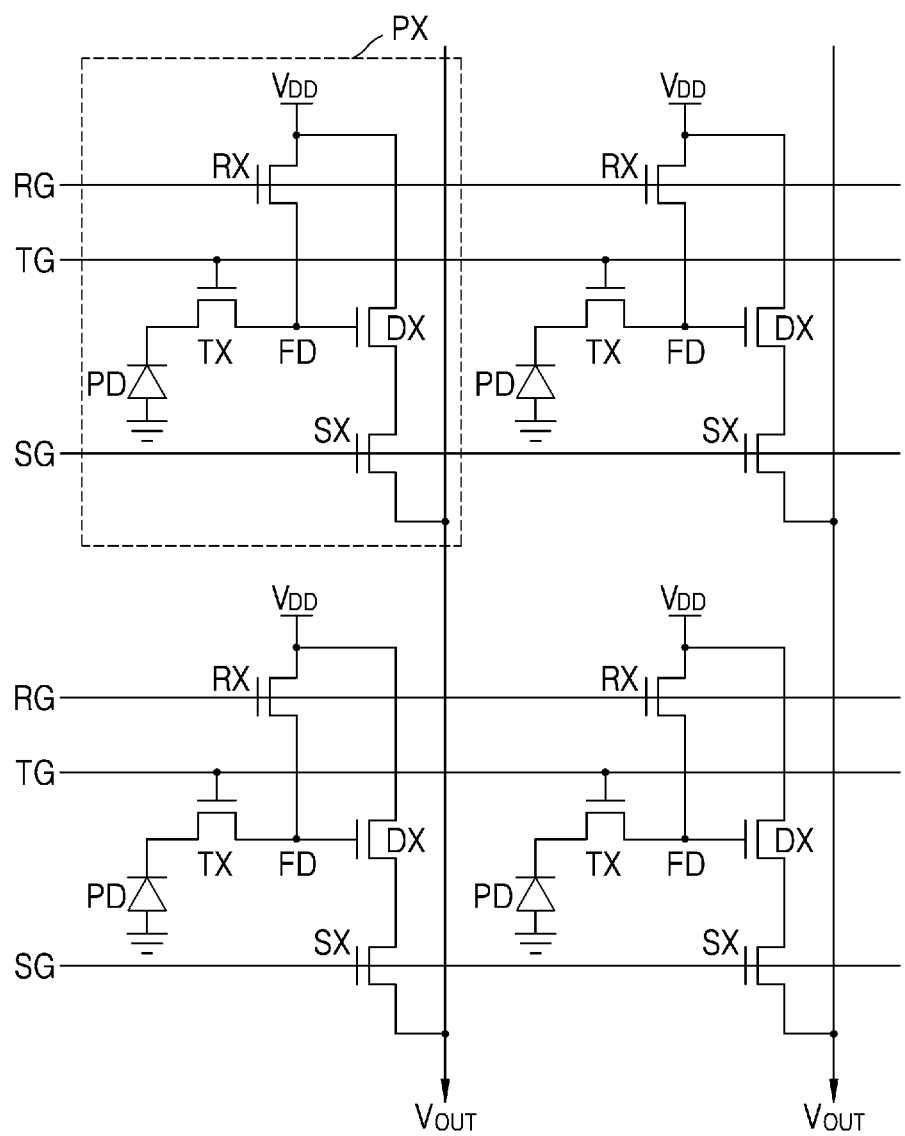
FIG. 6 is a circuit diagram of pixels of an image sensor according to an exemplary embodiment of the present inventive concept.

FIG. 6 is an circuit diagram of pixels of the image sensor 100 according to an exemplary embodiment of the present inventive concept.

Referring to FIG. 6, a plurality of pixels PX may be arranged in a matrix form. Each of the plurality of pixels PX may include a transfer transistor TX and logic transistors. The logic transistors may include a reset transistor RX, a selection transistor SX, and a drive transistor DX (or a source follower transistor). The reset transistor RX may include a reset gate RG, the selection transistor SX may include a selection gate SG, the drive transistor DX may include a source follower gate SF, and the transfer transistor TX may include a transfer gate TG.

Each of the plurality of pixels PX may include a photoelectric conversion element PD and a floating diffusion region FD. The photoelectric conversion element PD may correspond to the photoelectric conversion region 120 described with reference to FIGS. 1 to 5. The photoelectric conversion element PD may generate and accumulate photocharges in proportion to an amount of light incident from the outside and may include, for example, a photodiode, a phototransistor, a photogate, a pinned photodiode (PPD), or a combination thereof.

The transfer transistor TX may transfer charges generated by the photoelectric conversion element PD to the floating diffusion region FD. The floating diffusion region FD may receive and cumulatively store charges generated by the photoelectric conversion element PD. The drive transistor DX may be controlled according to an amount of photocharges accumulated in the floating diffusion region FD.

The reset transistor RX may periodically reset charges accumulated in the floating diffusion region FD. A drain electrode of the reset transistor RX is connected to the floating diffusion region FD, and a source electrode thereof is connected to a power voltage $V_{DD}$. When the reset transistor RX is turned on, the power voltage $V_{DD}$ connected to the source electrode of the reset transistor RX is transferred to the floating diffusion region FD. When the reset transistor RX is turned on, charges accumulated in the floating diffusion region FD are discharged, and thus, the floating diffusion region FD may be reset.

The drive transistor DX is connected to a current source located outside the pixels PX and functions as a source follower buffer amplifier, and may amplify a potential in the floating diffusion region FD and output an amplified potential to an output line $V_{OUT}$.

The selection transistor SX may select the pixels PX in units of rows, and when the selection transistor SX is turned on, the power voltage $V_{DD}$ may be transferred to a source electrode of the drive transistor DX.

Figure 7:
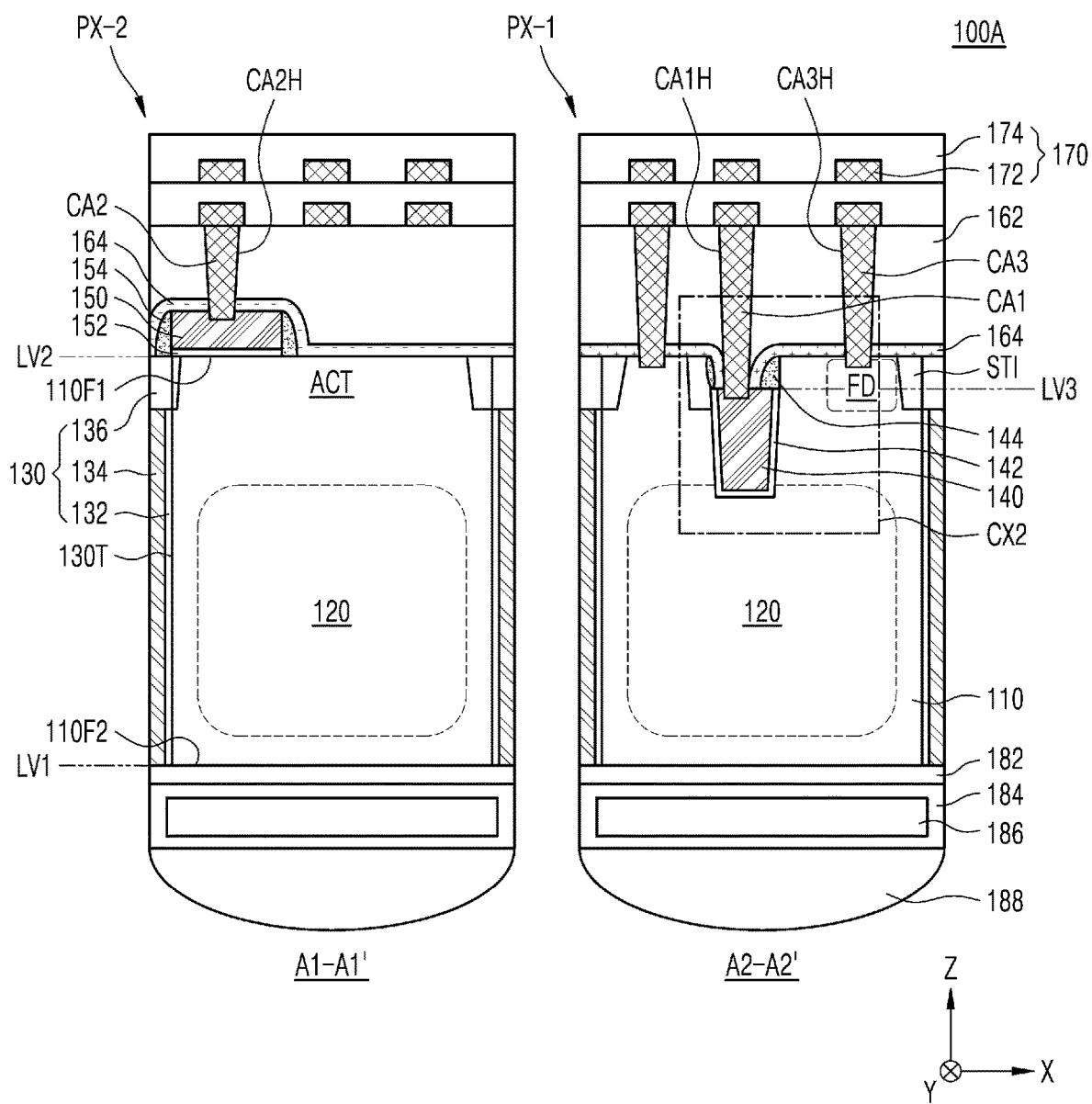
FIG. 7 is a cross-sectional view illustrating an image sensor according to an exemplary embodiment of the present inventive concept.
Figure 8:
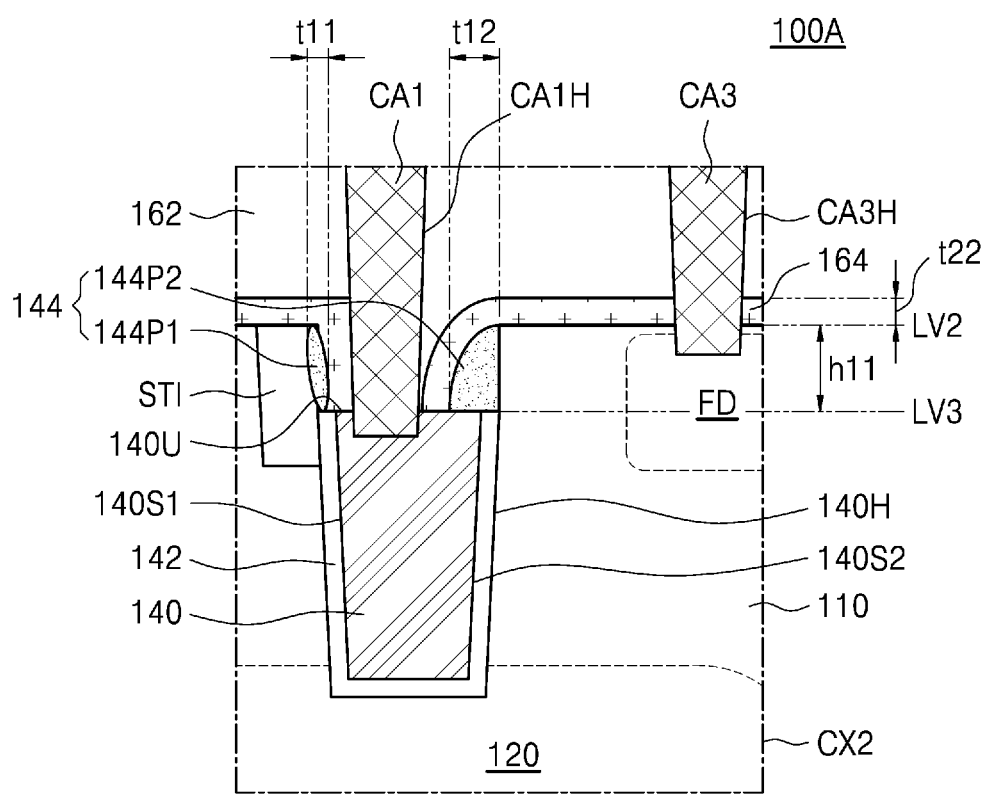
FIG. 8 is an enlarged view of a region CX2 of FIG. 7.

FIG. 7 is a cross-sectional view illustrating an image sensor 100A according to an exemplary embodiment of the present inventive concept. FIG. 8 is an enlarged view of a region CX2 of FIG. 7. In FIGS. 7 and 8, the same reference numerals as those in FIGS. 1 to 6 denote the same components as those in FIGS. 1 to 6, and thus, redundant descriptions may be omitted.

Referring to FIGS. 7 and 8, an insulating liner 164 may be arranged on a first surface 110F1 of a semiconductor substrate 110. The insulating liner 164 may cover an active region ACT, an isolation layer STI, an upper surface of a first gate electrode 150, and a gate spacer 154, and may be arranged on an upper sidewall of a transfer gate trench 140H. The insulating liner 164 may cover a transfer gate spacer 144 and an upper surface of a buried transfer gate electrode 140 but may not completely fill an upper portion of the transfer gate trench 140H. For example, the insulating liner 164 may have a fourth thickness t22 in a direction perpendicular to the first surface 110F1 of the semiconductor substrate 110. For example, the fourth thickness t22 may be in the range of about 5 nm to about 50 nm.

In an exemplary embodiment of the present inventive concept, an etch stop layer may be between the insulating liner 164 and the first surface 110F1 of the semiconductor substrate 110, and the etch stop layer may include a material having an etch selectivity with respect to the insulating liner 164.

In an exemplary embodiment of the present inventive concept, a first contact CA1, a second contact CA2, and a third contact CA3 may pass through an interlayer insulating layer 162 and the insulating liner 164 and may be connected to the buried transfer gate electrode 140, the first gate electrode 150, and the active region ACT, respectively. For example, the first contact CA1, the second contact CA2, and the third contact CA3 may be self-aligned contacts. For example, as the insulating liner 164 does not completely fill the upper portion of the transfer gate trench 140H, the interlayer insulating layer 162 may be formed to have a recess region 162R (refer to FIG. 29) having an upper surface arranged at a level below the uppermost surface of the interlayer insulating layer 162 but above the transfer gate trench 140H. A first contact hole CA1H may be formed by etching a portion of the interlayer insulating layer 162 at a location where the recess region 162R is formed, and accordingly, the first contact hole CA1H, a second contact hole CA2H, and a third contact hole CA3H, which have different heights from each other, may be formed using the same process.

According to an exemplary embodiment of the present inventive concept, an increase in parasitic capacitance between the buried transfer gate electrode 140 and the floating diffusion region FD, or generation of a GIDL current may be prevented, and the image sensor 100A may have increased image quality.

Figure 9:
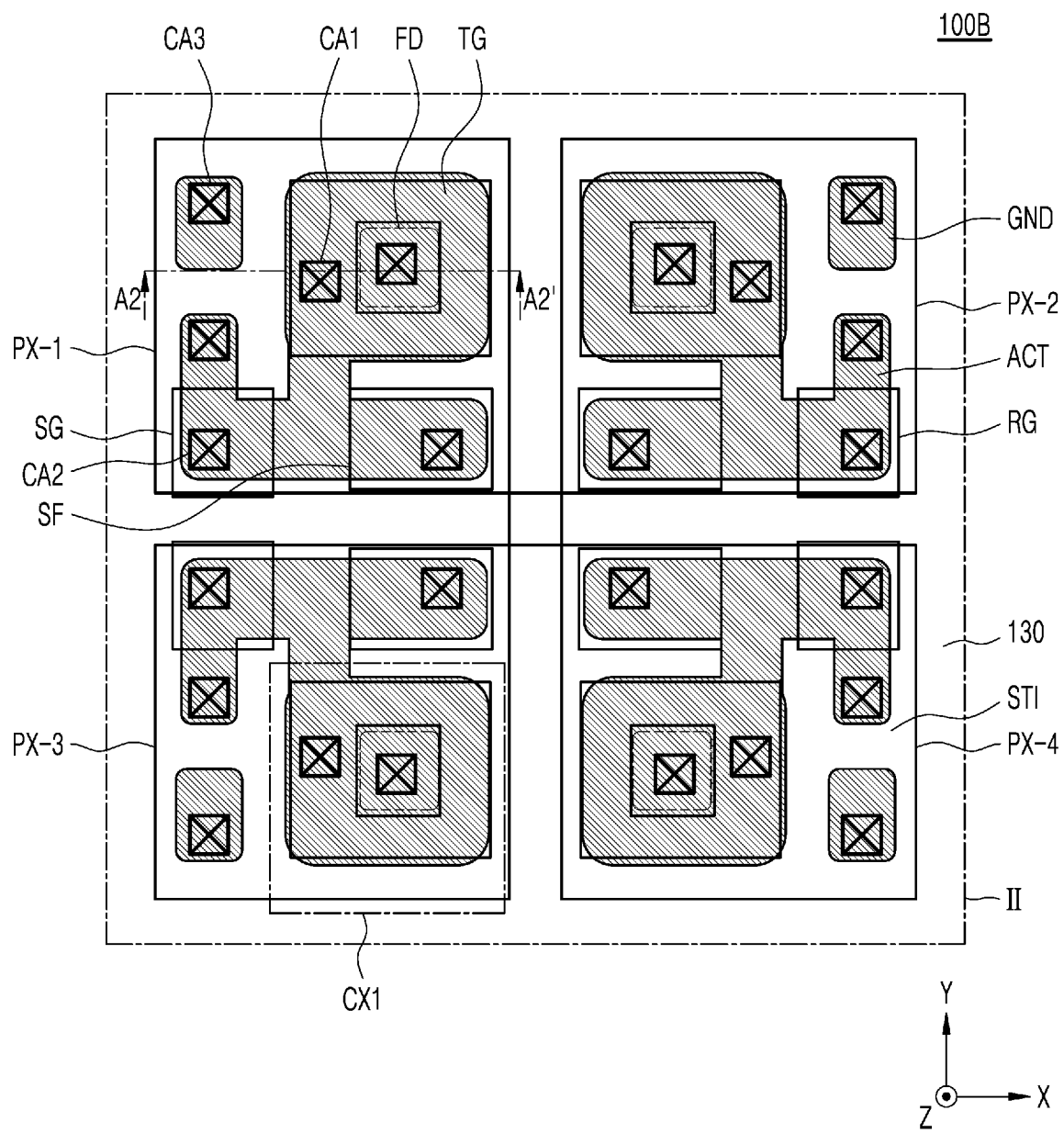
FIG. 9 is a layout diagram of an image sensor according to an exemplary embodiment of the present inventive concept.
Figure 10:
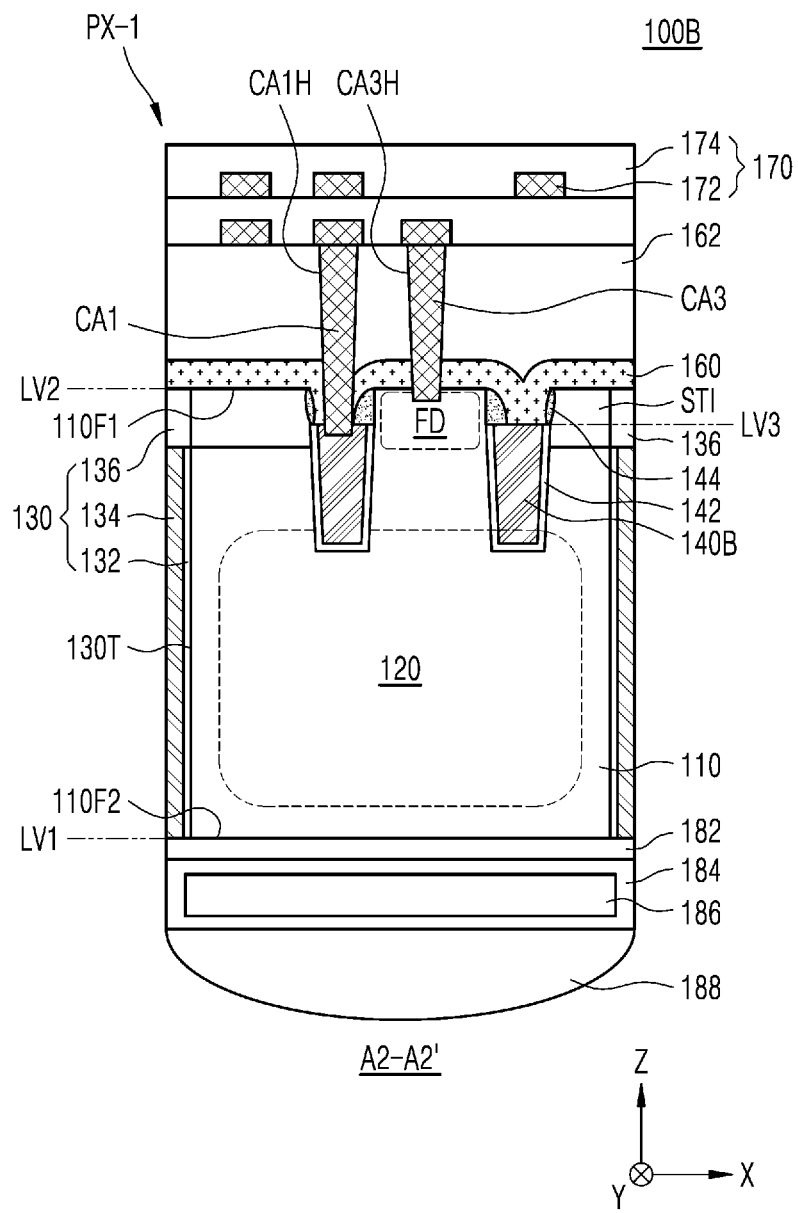
FIG. 10 is a cross-sectional view taken along line A2-A2' of FIG. 9.
Figure 11:
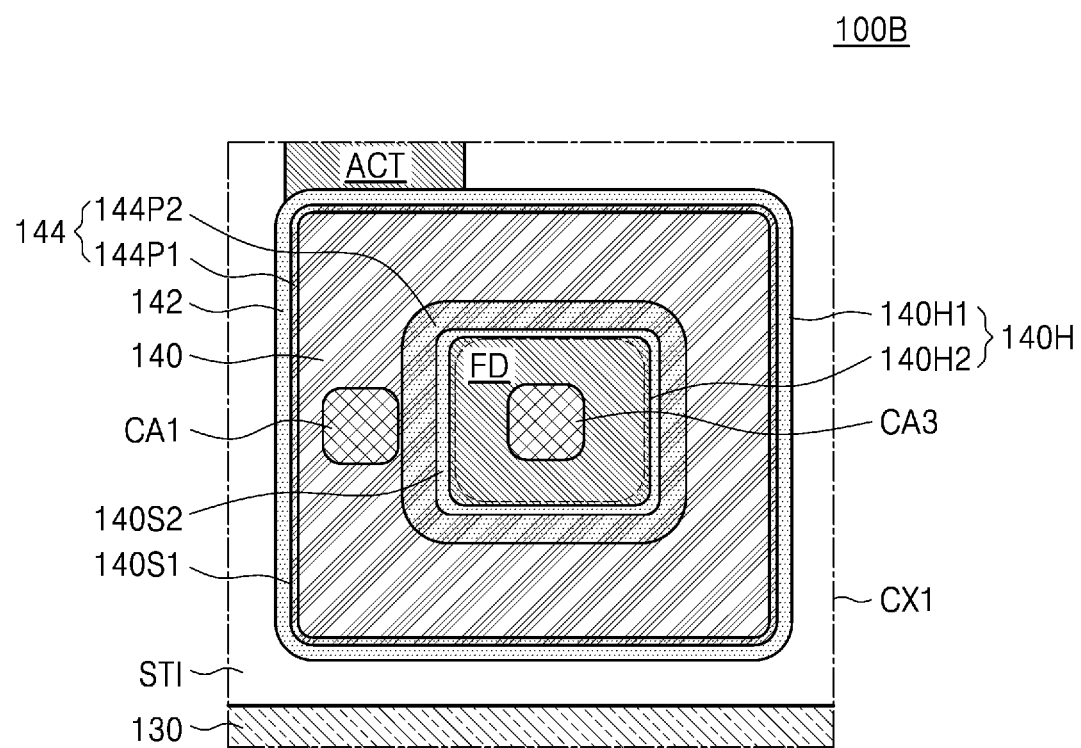
FIG. 11 is an enlarged view of a region CX1 of FIG. 9.

FIG. 9 is a layout diagram of an image sensor 100B according to an exemplary embodiment of the present inventive concept, FIG. 10 is a cross-sectional view taken along line A2-A2' of FIG. 9, and FIG. 11 is an enlarged view of a region CX1 of FIG. 9. In FIGS. 9 to 11, the same reference numerals as those in FIGS. 1 to 8 denote the same components as those in FIGS. 1 to 8, and thus redundant descriptions may be omitted.

Referring to FIGS. 9 to 11, in a plan view, a buried transfer gate electrode 140B may have an annular shape surrounding the floating diffusion region FD. For example, the transfer gate trench 140H may include a first sidewall 140H1 and a second sidewall 140H2. In a plan view, the second sidewall 140H2 may have an annular shape surrounding the floating diffusion region FD, and the first sidewall 140H1 may have an annular shape surrounding the second sidewall 140H2 and be apart from the first sidewall 140H1.

The transfer gate spacer 144 may include a first portion 144P1 arranged on the first sidewall 140H1 of the transfer gate trench 140H and a second portion 144P2 arranged on the second sidewall 140H2 of the transfer gate trench 140H. The second portion 144P2 may be arranged apart from the first portion 144P1. In FIG. 11, the second portion 144P2 is illustrated as having a greater thickness than the first portion 144P1, but the present inventive concept is not limited thereto.

It is illustrated in FIG. 11 that, in a plan view, the center of the buried transfer gate electrode 140B and the center of the floating diffusion region FD overlap each other and the buried transfer gate electrode 140B surrounds all four sidewalls of the floating diffusion region FD. For example, the floating diffusion region FD is disposed in the opening of the annular shape of the buried transfer gate electrode 140B. However, unlike in FIG. 11, in a plan view, the center of the buried transfer gate electrode 140B may be offset from the center of the floating diffusion region FD, and the buried transfer gate electrode 140B may be arranged to surround two sidewalls or three sidewalls of the floating diffusion region FD.

According to an exemplary embodiment of the present inventive concept, as the buried transfer gate electrode 140B is formed in a gate around type surrounding a sidewall of the floating diffusion region FD, a charge transfer path may be formed in a direction perpendicular to the first surface 110F1 of the semiconductor substrate 110. Accordingly, the sensitivity of a low-illuminance characteristic that may be easily deteriorated according to the shape of the transfer gate TG (for example, by a potential profile generated according to the shape of the transfer gate TG) may be improved. In addition, by adjusting the depth of an upper surface 140U of the buried transfer gate electrode 140B, generation of a GIDL current between the floating diffusion region FD and the buried transfer gate electrode 140B may be prevented. The image sensor 100B may have increased image quality.

Figure 12:
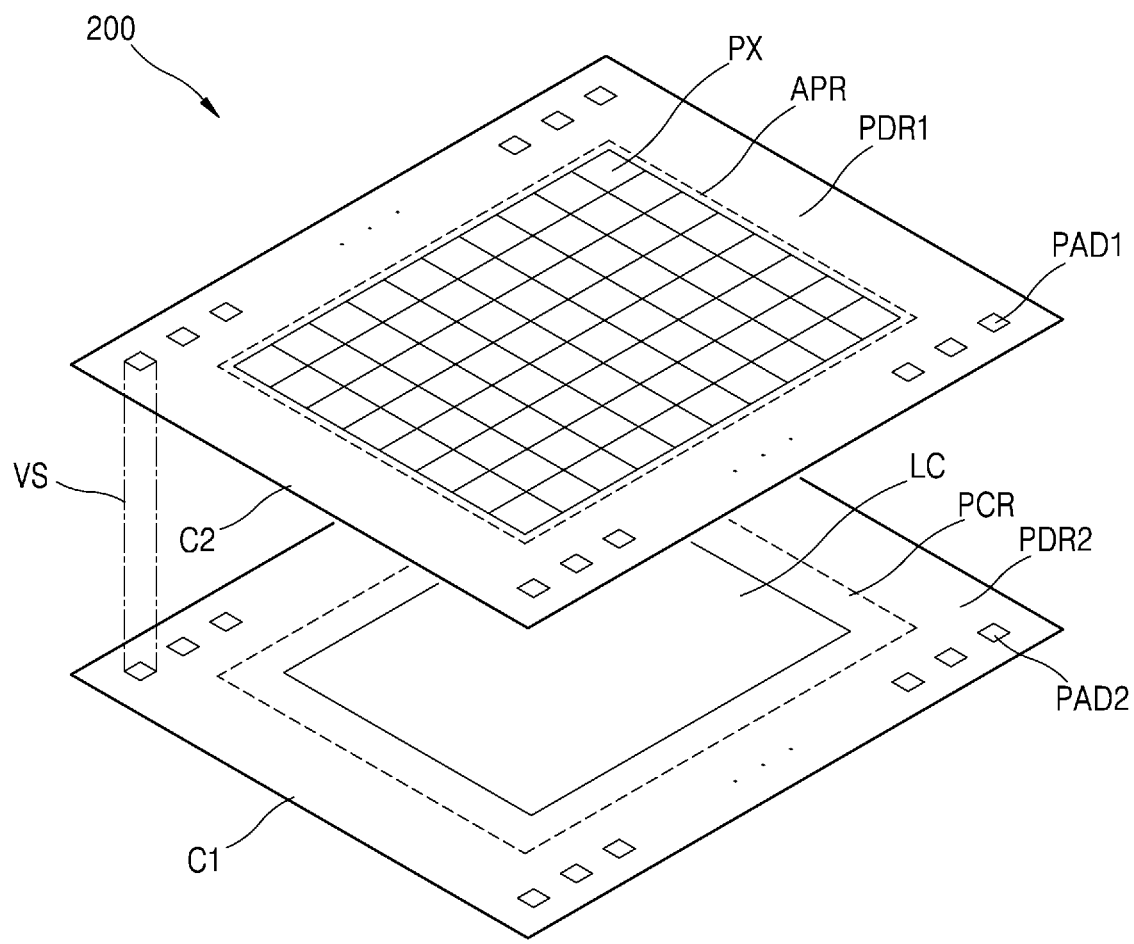
FIG. 12 is a schematic diagram illustrating an image sensor according to an exemplary embodiment of the present inventive concept.

FIG. 12 is a schematic diagram illustrating an image sensor 200 according to an exemplary embodiment of the present inventive concept.

Referring to FIG. 12, the image sensor 200 may be a stacked image sensor including a first chip C1 and a second chip C2 stacked in a vertical direction. The first chip C1 may include an active pixel region APR and a first pad region PDR1, and the second chip C2 may include a peripheral circuit region PCR and a second pad region PDR2.

A plurality of first pads PAD1 of the first pad region PDR1 may be configured to transmit and receive electrical signals to and from an external device. The peripheral circuit region PCR may include a logic circuit block LC and a plurality of complementary metal-oxide semiconductor (CMOS) transistors. The peripheral circuit region PCR may provide a constant signal to each active pixel PX of the active pixel region APR or control an output signal from each active pixel PX. The first pads PAD1 in the first pad region PDR1 may be electrically connected by a via structure VS to second pads PAD2 in the second pad region PDR2.

FIGS. 13 to 28 are cross-sectional views illustrating a method of manufacturing the image sensor 100, according to an exemplary embodiment of the present inventive concept. In FIGS. 13 to 28, the same reference numerals as those in FIGS. 1 to 12 denote the same components as those in FIGS. 1 to 12, and thus, redundant descriptions may be omitted.

Figure 13:
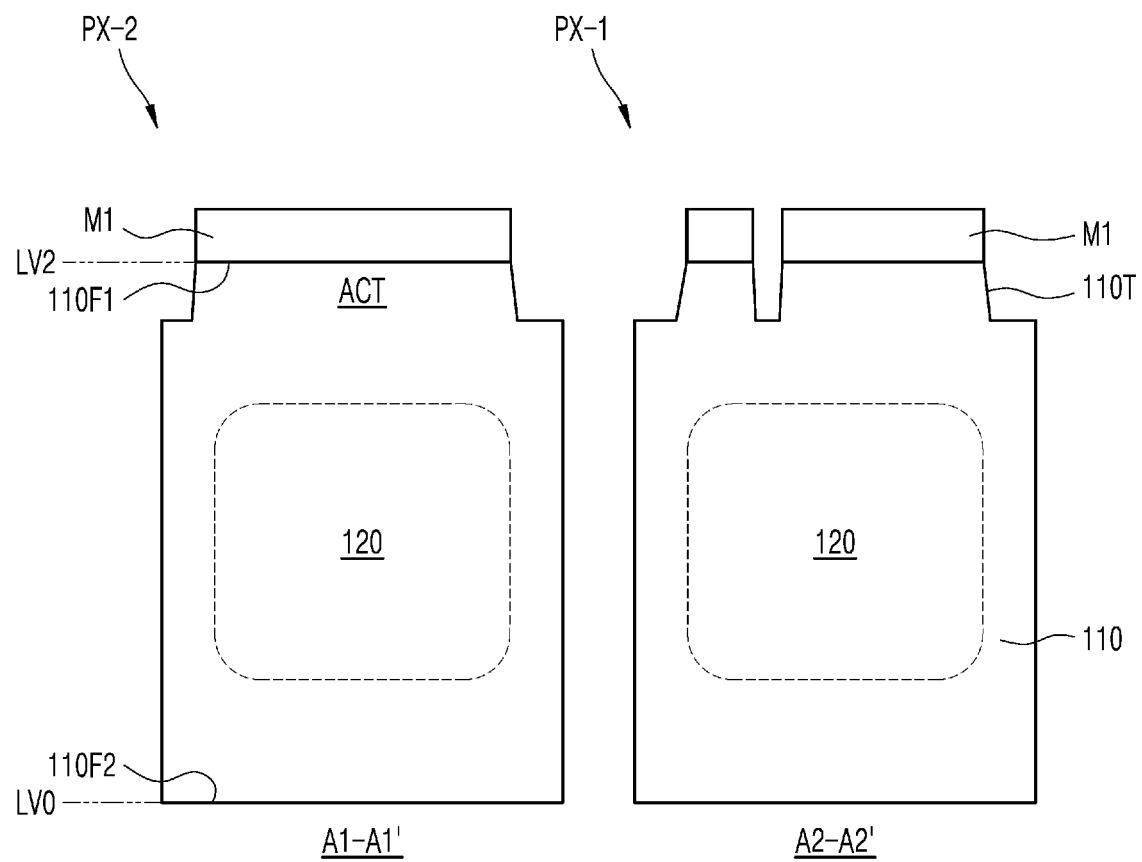
FIGS. 13, 14, 15, 16, 17, 18, 19, 20, 21, 22, 23, 24, 25, 26, 27 and 28 are cross-sectional views illustrating a method of manufacturing an image sensor, according to an exemplary embodiment of the present inventive concept.

Referring to FIG. 13, a semiconductor substrate 110 having a first surface 110F1 and a second surface 110F2, which are opposite to each other, is prepared. In this case, the second surface 110F2 may be arranged at a reference level LV0, and the first surface 110F1 may be arranged at a second vertical level LV2.

A photoelectric conversion region 120 may be formed by, for example, an ion implantation process from the first surface 110F1 of the semiconductor substrate 110. For example, the photoelectric conversion region 120 may include a photodiode region and a well region. The photodiode region may be doped with N-type impurities, and the well region may be doped with P-type impurities.

Thereafter, a first mask pattern M1 may be formed on the first surface 110F1 of the semiconductor substrate 110, and an isolation trench 110T may be formed in the semiconductor substrate 110 by using the first mask pattern M1 as a mask.

Figure 14:
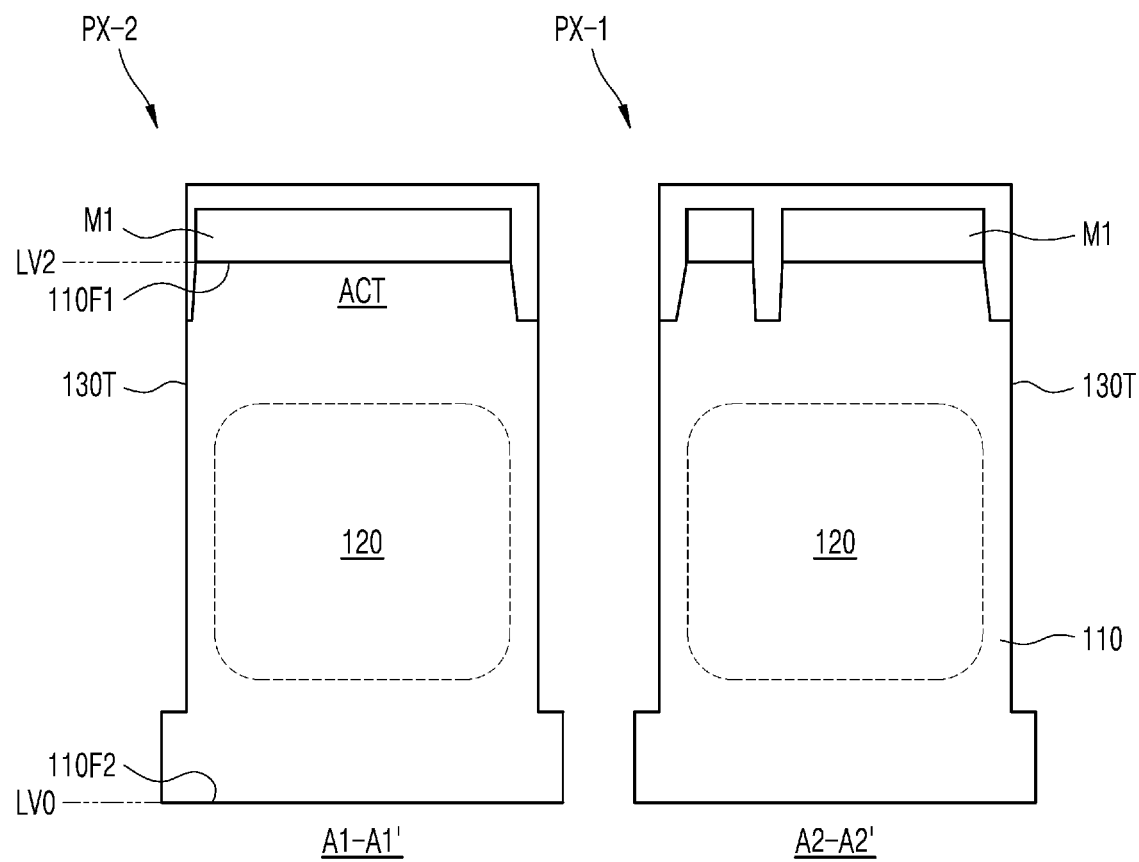

Referring to FIG. 14, an isolation layer STI may be formed in the isolation trench 110T by filling an insulating material in the isolation trench 110T. The isolation layer STI may be formed to cover the first mask pattern M1.

Thereafter, a mask pattern may be formed on the first surface 110F1 of the semiconductor substrate 110, and a pixel trench 130T may be formed in the semiconductor substrate 110 by using the mask pattern. The pixel trench 130T may have a predetermined depth from the first surface 110F1 of the semiconductor substrate 110 and may be formed in a matrix form in a plan view.

Figure 15:
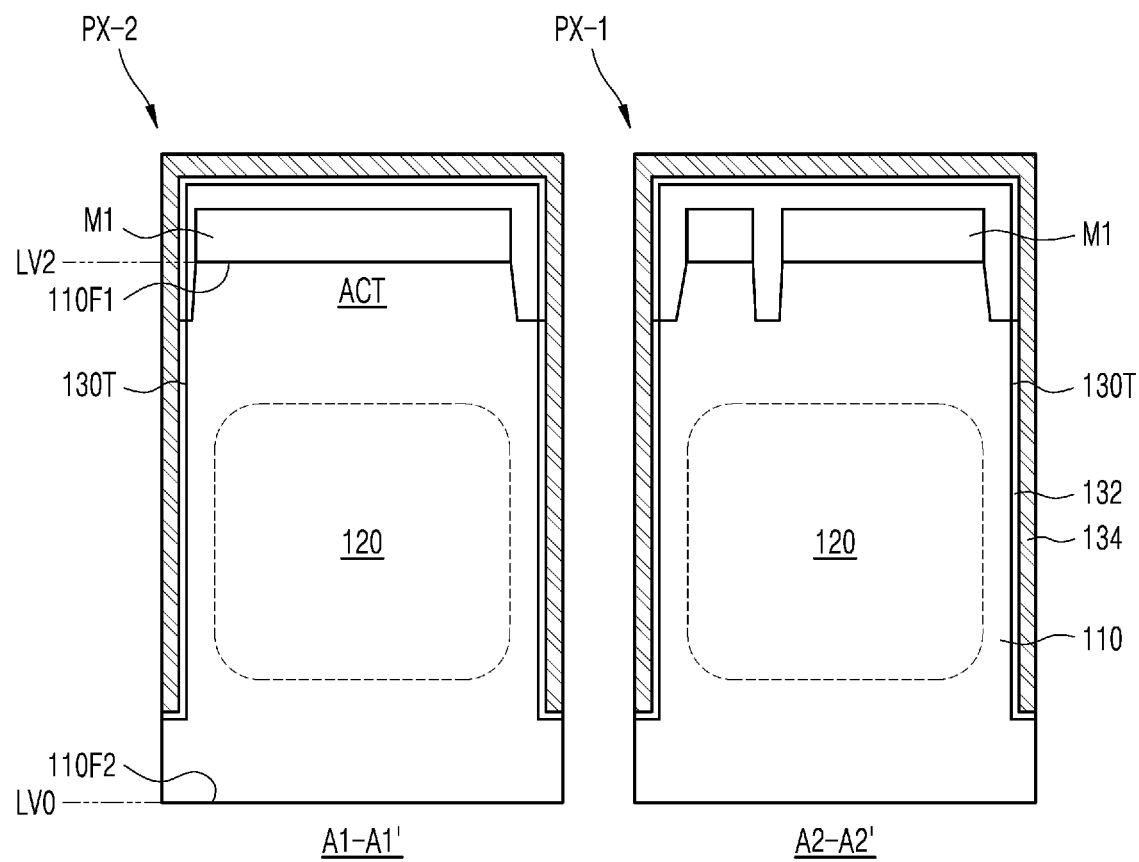

Referring to FIG. 15, an insulating layer 132 may be conformally formed, by, for example, a chemical vapor deposition (CVD) process or an atomic layer deposition (ALD) process, on the first surface 110F1 of the semiconductor substrate 110 and the inner wall of the pixel trench 130T. Thereafter, a conductive layer 134 filling the inner wall of the pixel trench 130T may be formed on the insulating layer 132.

Figure 16:
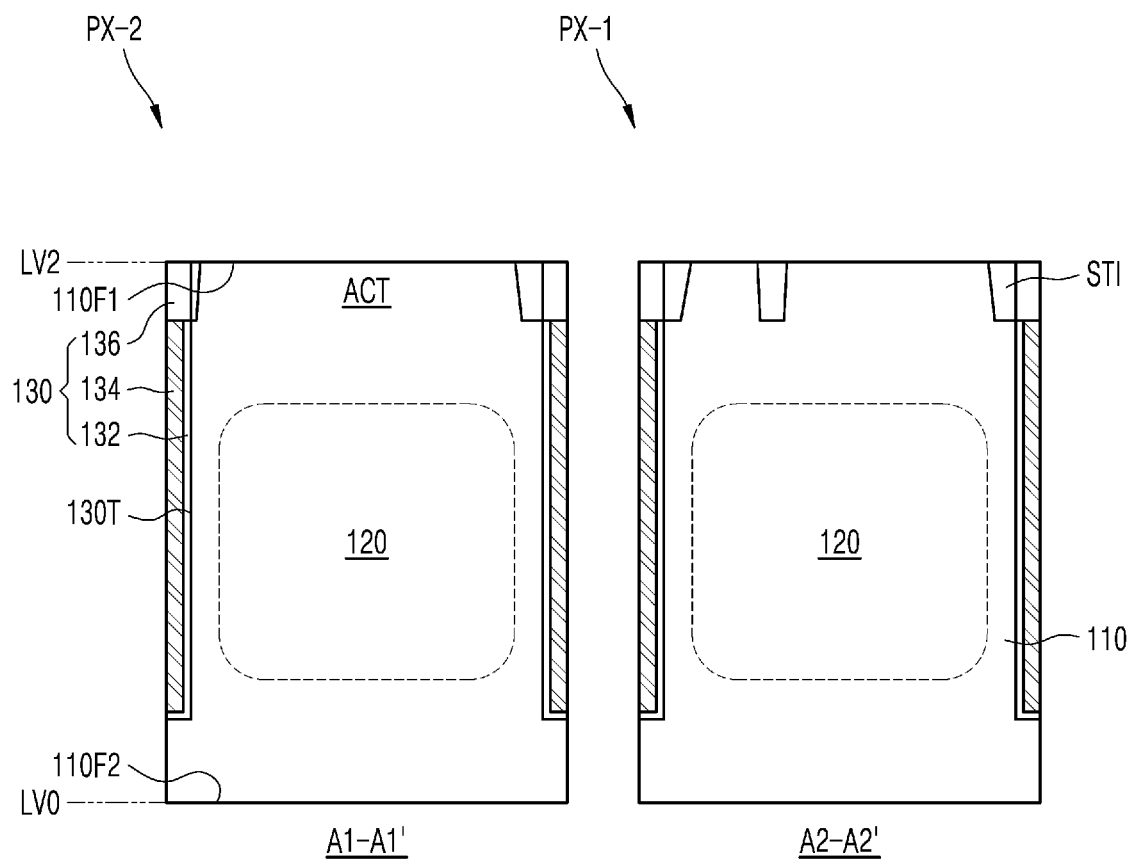

Referring to FIG. 16, a portion of the insulating layer 132 and a portion of the conductive layer 134 may be removed so that an upper surface of the first surface 110F1 of the semiconductor substrate 110 is exposed. Thereafter, a portion of the insulating layer 132 and a portion of the conductive layer 134, which are arranged on the upper side of the pixel trench 130T, may be removed by an etch-back process, and an upper insulating layer 136 may be formed on the upper side of the pixel trench 130T by filling, with an insulating material, a space in which the portion of the insulating layer 132 and the portion of the conductive layer 134 are removed.

Figure 17:
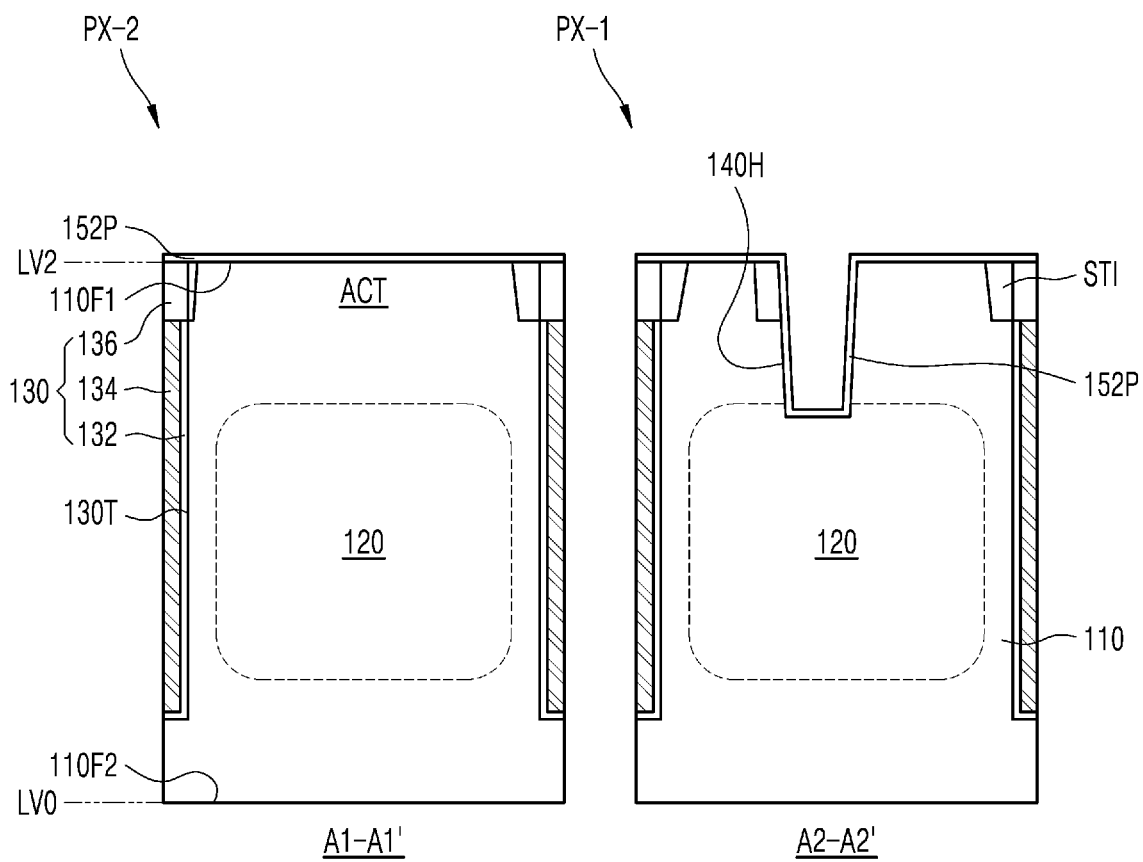

Referring to FIG. 17, a mask pattern may be formed on the first surface 110F1 of the semiconductor substrate 110, and a portion of the semiconductor substrate 110 may be removed using the mask pattern as an etch mask to form a transfer gate trench 140H.

Thereafter, a preliminary gate insulating layer 152P may be conformally formed on the first surface 110F1 of the semiconductor substrate 110 and the inner wall of the transfer gate trench 140H.

Figure 18:
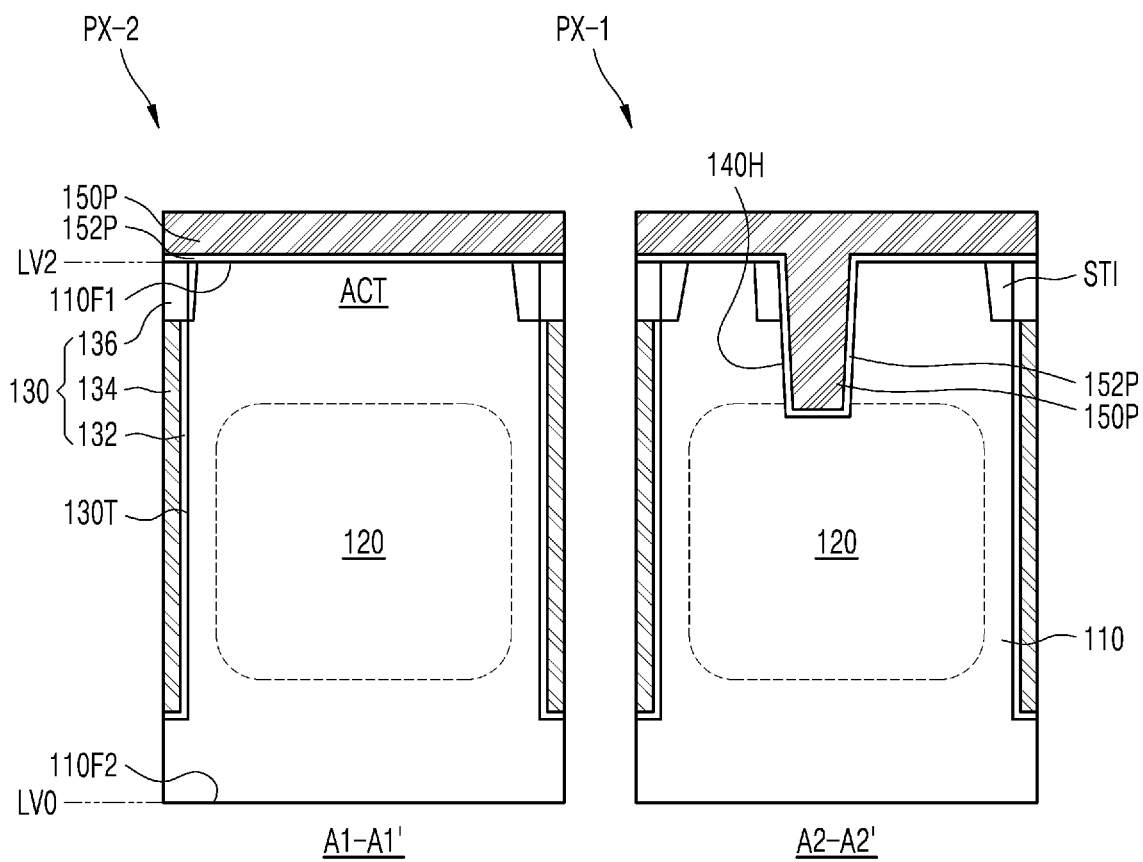
Figure 18:
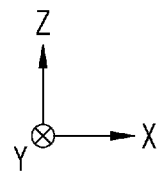

Referring to FIG. 18, a preliminary gate electrode 150P may be formed on the preliminary gate insulating layer 152P. The preliminary gate electrode 150P may fill the transfer gate trench 140H and may be formed to have a thickness of about 50 nm to about 500 nm on the first surface 110F1 of the semiconductor substrate 110. In an exemplary embodiment of the present inventive concept, the preliminary gate electrode 150P may be formed using at least one of a doped polysilicon, a metal, a metal silicide, a metal nitride, and/or a metal-containing layer.

Figure 19:
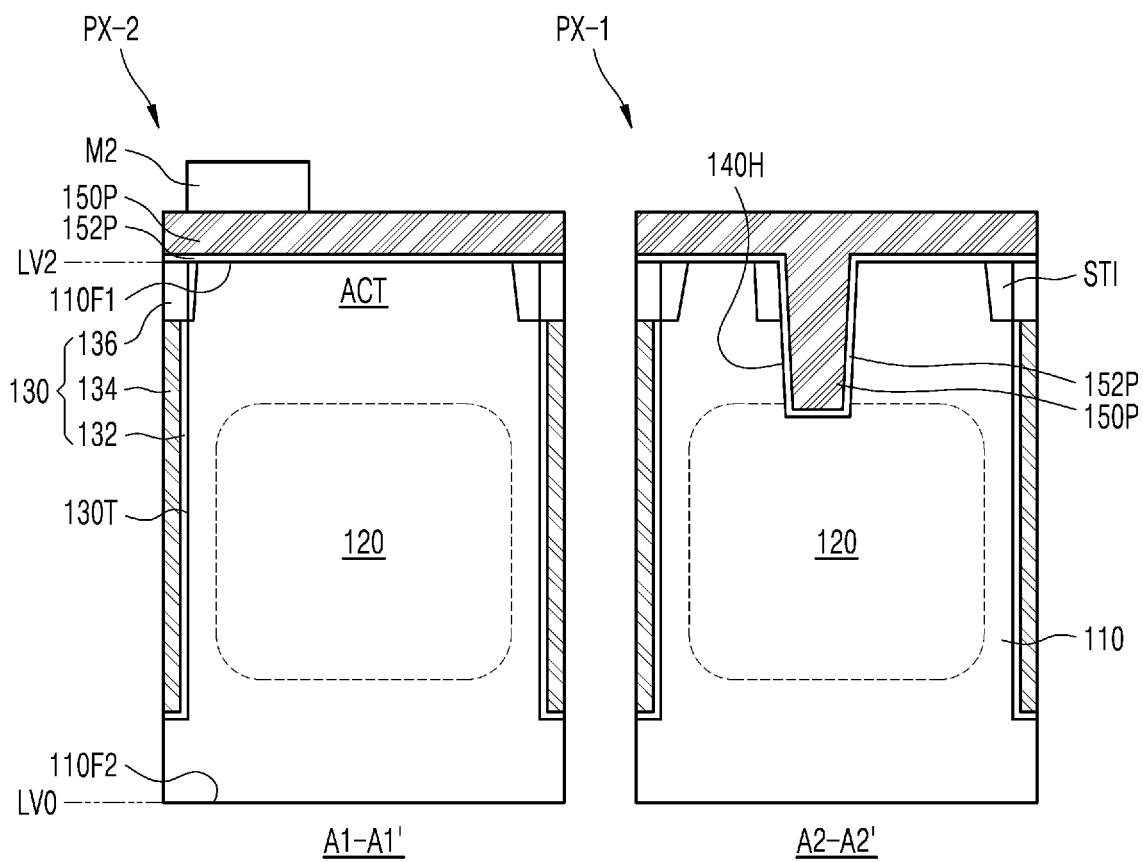

Referring to FIG. 19, a second mask pattern M2 may be formed on the preliminary gate electrode 150P. The second mask pattern M2 may be arranged on a location where a reset gate RG, a selection gate SG, and a source follower gate SF are to be formed, and may not be arranged on a location where a transfer gate TG is to be formed. For example, a portion of the preliminary gate electrode 150P filling the inside of the transfer gate trench 140H may not be covered by the second mask pattern M2.

In a method of manufacturing an image sensor according to a comparative example, the second mask pattern M2 is arranged at a location where the transfer gate TG is to be formed, and the transfer gate TG is patterned using the second mask pattern M2. However, as the transfer gate TG is formed to have a triangular shape from a horizontal cross-sectional view rather than a rectangular shape, the second mask pattern M2 corresponding to the transfer gate TG may be easily lifted in the patterning process, and the lifting margin of the second mask pattern M2 may be relatively small. However, according to an exemplary embodiment of the present inventive concept, as the second mask pattern M2 corresponding to the transfer gate TG is not formed, the lifting margin of the second mask pattern M2 may be improved.

Figure 20:
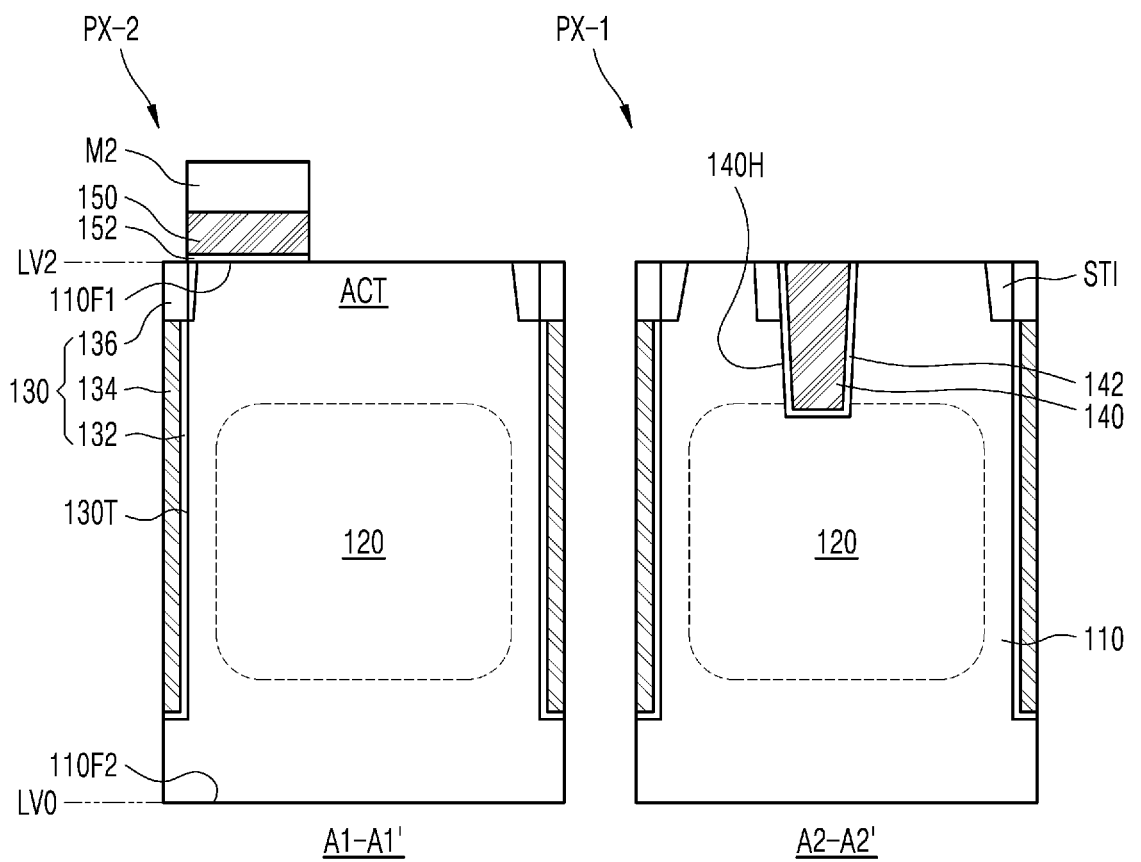

Referring to FIG. 20, a first gate electrode 150 may be formed by removing a portion of the preliminary gate electrode 150P by using the second mask pattern M2 as an etch mask. For example, a portion of the preliminary gate electrode 150P disposed on the upper surface of the first surface 110F1 may be removed by using the second mask pattern M2. In this case, a portion of the preliminary gate electrode 150P, which is arranged in the transfer gate trench 140H, may remain without being removed. The portion of the preliminary gate electrode 150P, which is arranged in the transfer gate trench 140H, may be referred to as a buried transfer gate electrode 140.

After the first gate electrode 150 is formed, a portion of the preliminary gate insulating layer 152P, which is arranged on the first surface 110F1 of the semiconductor substrate 110, may be removed, and a gate insulating layer 152 may remain under the first gate electrode 150. In addition, a portion of the preliminary gate insulating layer 152P, which remains in the transfer gate trench 140H, may be referred to as a transfer gate insulating layer 142.

According to an exemplary embodiment of the present inventive concept, unlike in FIG. 20, a portion of the preliminary gate insulating layer 152P, which is arranged on the first surface 110F1 of the semiconductor substrate 110, may remain without being removed.

Figure 21:
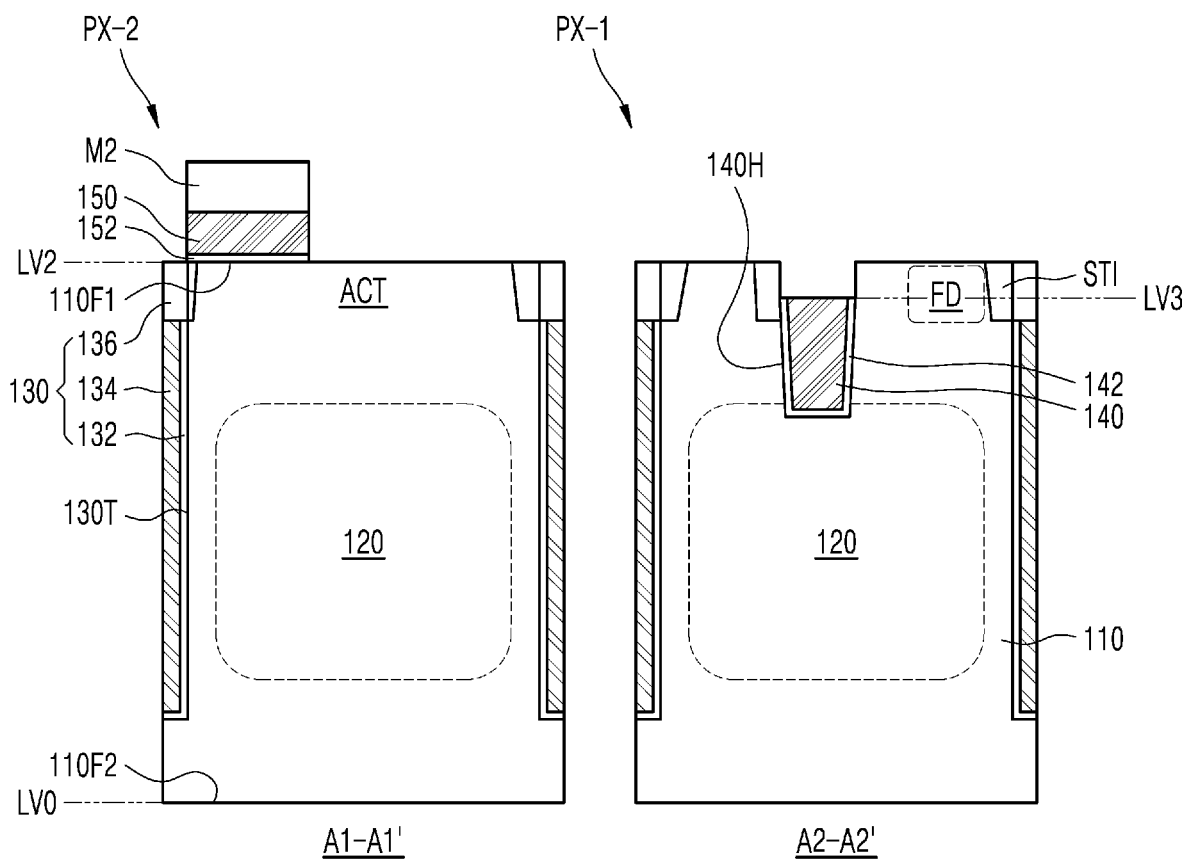

Referring to FIG. 21, an upper portion of the buried transfer gate electrode 140 may be removed by a predetermined thickness by performing an etch-back process on the first surface 110F1 of the semiconductor substrate 110 while the second mask pattern M2 covers the upper surface of the first gate electrode 150. Accordingly, an upper surface 140U (refer to FIG. 5) of the buried transfer gate electrode 140 may be arranged at a third vertical level LV3 that is lower than a second vertical level LV2. The upper surface 140U of the buried transfer gate electrode 140 may have a first depth h11 (refer to FIG. 5) from the first surface 110F1 of the semiconductor substrate 110, and the first depth h11 may be in the range of about 5 nm to about 200 nm.

Thereafter, the second mask pattern M2 may be removed. As illustrated in FIG. 21, in the etch-back process, a portion of the transfer gate insulating layer 142 arranged on an upper sidewall of the transfer gate trench 140H may be removed. In addition, the portion of the transfer gate insulating layer 142 may not be removed and may remain on the upper sidewall of the transfer gate trench 140H.

Thereafter, a floating diffusion region FD may be formed by performing an ion implantation process on a partial region on the first surface 110F1 of the semiconductor substrate 110.

Figure 22:
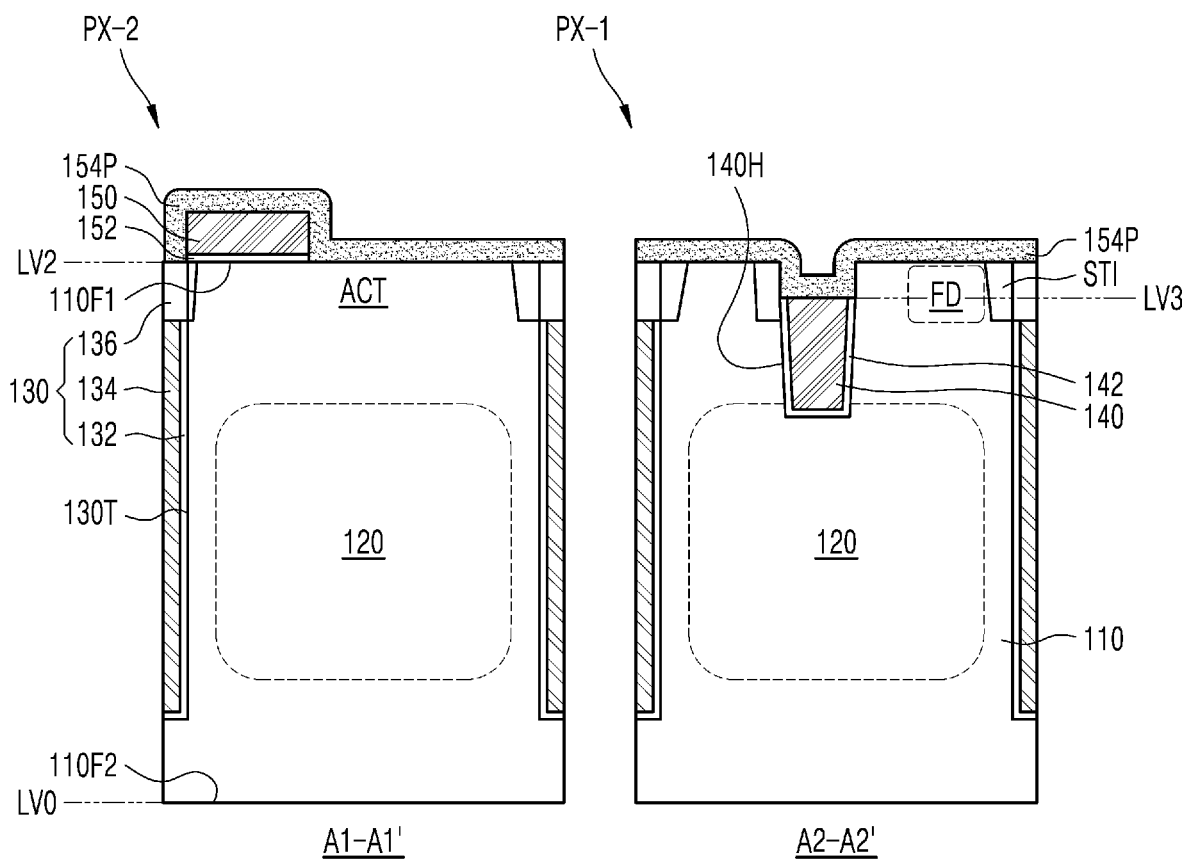

Referring to FIG. 22, a preliminary spacer layer 154P covering the first gate electrode 150 may be formed on the first surface 110F1 of the semiconductor substrate 110. The preliminary spacer layer 154P may be arranged in an upper portion of the transfer gate trench 140H to cover the upper surface of the buried transfer gate electrode 140.

Figure 23:
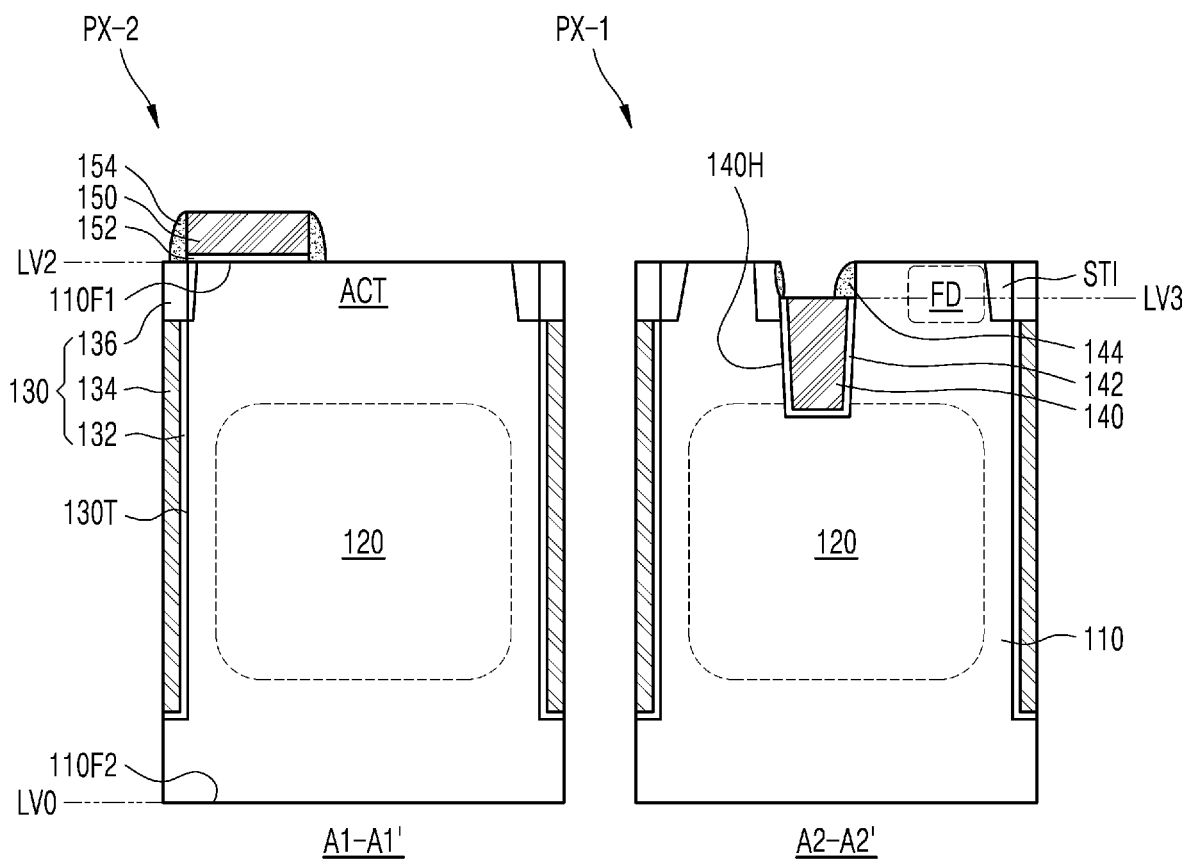
Figure 23:
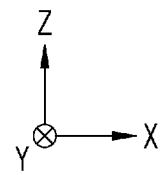

Referring to FIG. 23, a gate spacer 154 may be formed on the sidewall of the first gate electrode 150 by performing an anisotropic etching process on the preliminary spacer layer 154P, and a transfer gate spacer 144 may be formed on the inner wall of the transfer gate trench 140H. For example, the transfer gate spacer 144 may be formed on the transfer gate spacer 142 and the buried transfer gate electrode 140 while disposed on the inner wall of the transfer gate trench 140H.

In an exemplary embodiment of the present inventive concept, when the isolation layer STI is removed at a higher etch rate than the active region ACT in a process of forming the transfer gate trench 140H, the sidewall profile of a first sidewall 140S1 (refer to FIG. 5) of the transfer gate trench 140H may be different from the sidewall profile of a second sidewall 140S2 (refer to FIG. 5) of the transfer gate trench 140H. In this case, in the transfer gate spacer 144, a first thickness t11 of a first portion 144P1 (refer to FIG. 5) surrounded by the isolation layer ST1 may be less than a second thickness t12 of a second portion 144P2 (refer to FIG. 5) surrounded by an active region ACT.

Figure 24:
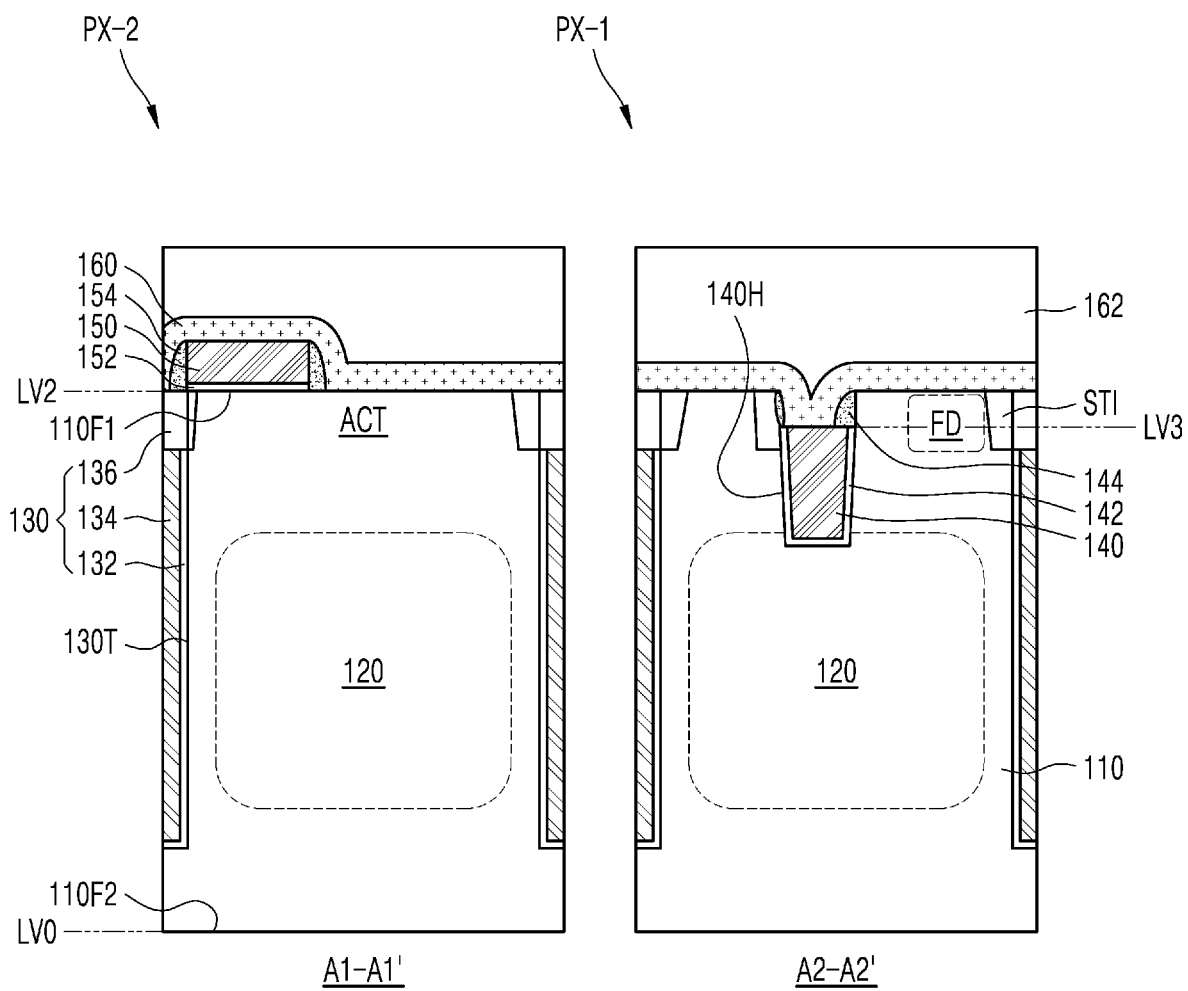

Referring to FIG. 24, a buried insulating layer 160 may be formed on the first surface 110F1 of the semiconductor substrate 110. In an exemplary embodiment of the present inventive concept, the buried insulating layer 160 may cover the first gate electrode 150 and the gate spacer 154, and may have a third thickness t21 (refer to FIG. 5) sufficient to fill the inside of the transfer gate trench 140H. For example, the buried insulating layer 160 may fill a remaining space in the transfer gate trench 140H.

An etch stop layer may be further formed on the first surface 110F1 of the semiconductor substrate 110 before the buried insulating layer 160 is formed.

Thereafter, an interlayer insulating layer 162 may be formed on the buried insulating layer 160.

Figure 25:
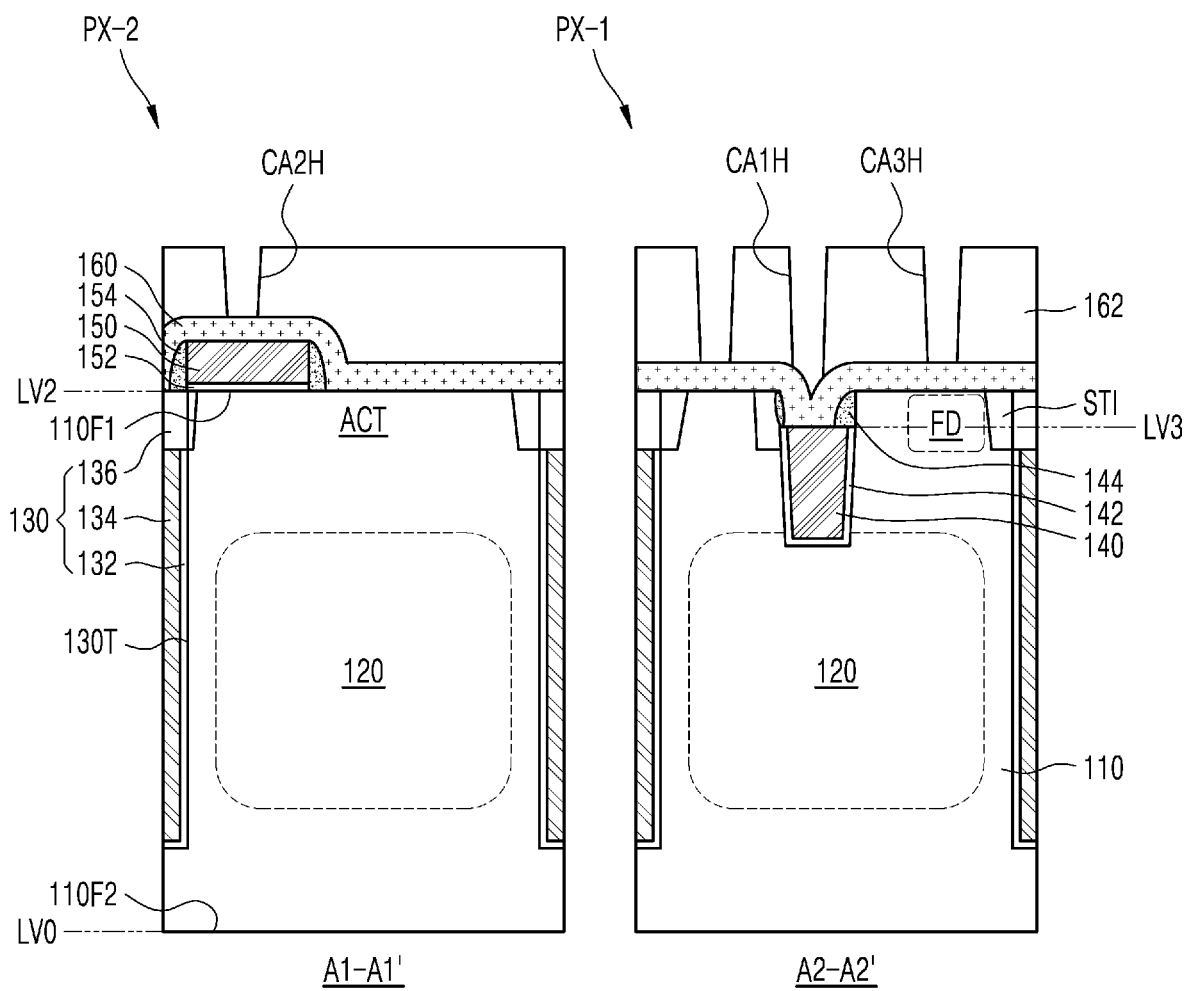

Referring to FIG. 25, a mask pattern may be formed on the interlayer insulating layer 162, and a first contact hole CA1H, a second contact hole CA2H, and a third contact hole CA3H, which pass through the interlayer insulating layer 162, may be formed by using the mask pattern as an etch mask.

In an exemplary embodiment of the present inventive concept, a process of forming the first to third contact holes CA1H, CA2H, and CA3H may be a process using an etching condition having an etch selectivity with respect to the material of the buried insulating layer 160. For example, the first to third contact holes CA1H, CA2H, and CA3H may be formed at substantially the same time; however, the present inventive concept is not limited thereto. For example, in the etching process, the etching rate of the interlayer insulating layer 162 may be significantly higher than the etching rate of the buried insulating layer 160. Accordingly, even though the height of the first contact hole CA1H is greater than the height of the second contact hole CA2H, a portion of the buried insulating layer 160 exposed at the bottom of the second contact hole CA2H may be hardly removed or be removed only by a relatively small thickness so that the buried insulating layer 160 is exposed at the bottom of the first contact hole CA1H in the etching process.

Figure 26:
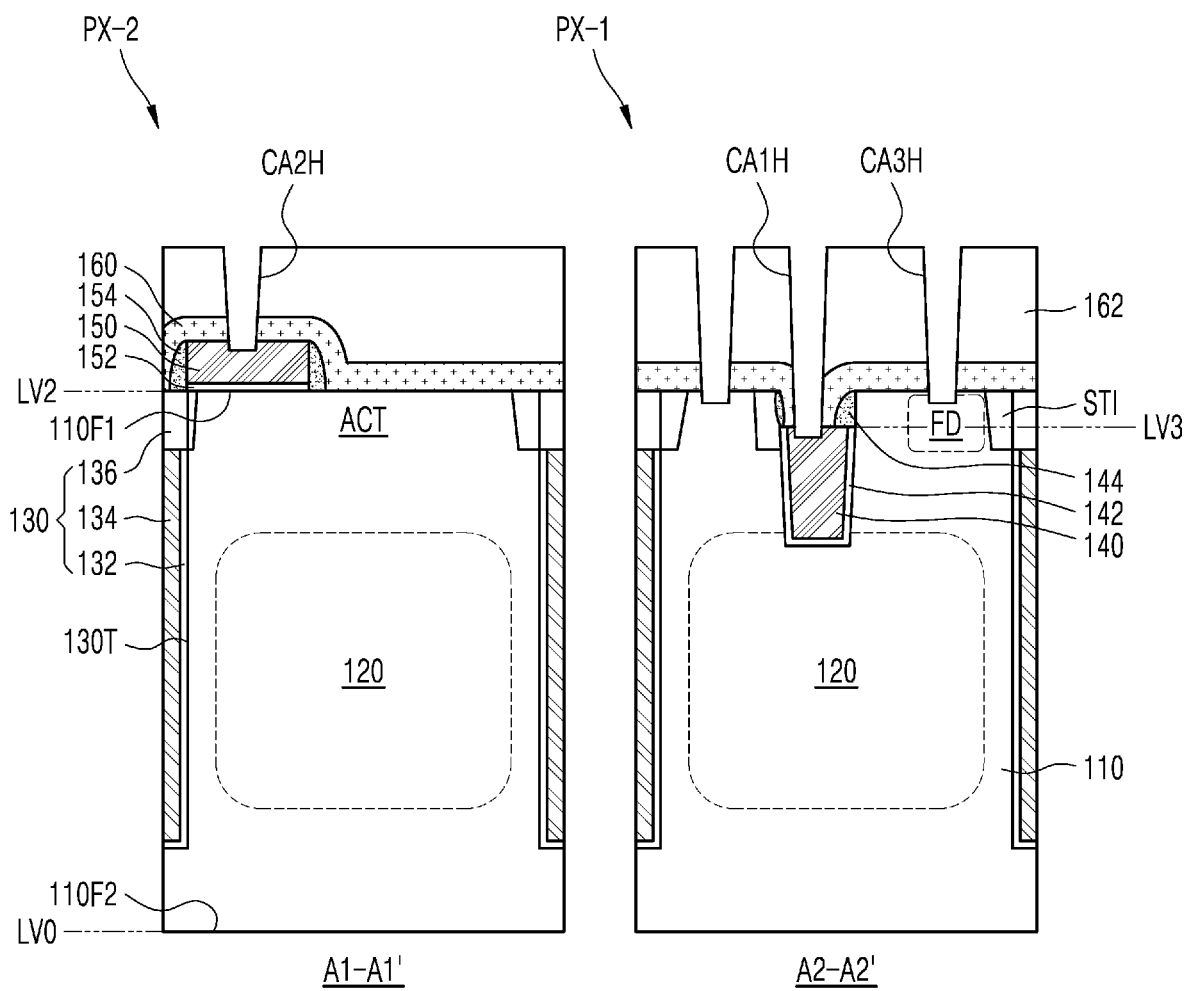

Referring to FIG. 26, a portion of the buried insulating layer 160 exposed at the bottoms of the first to third contact holes CA1H, CA2H, and CA3H may be removed. By the removal process, an upper surface of the buried transfer gate electrode 140 may be exposed at the bottom of the first contact hole CA1H, and an upper surface of the first gate electrode 150 may be exposed at the bottom of the second contact hole CA2H. Further, an upper surface of the active region ACT may be exposed at the bottom of the third contact hole CA3H, due to the removal process.

Figure 27:
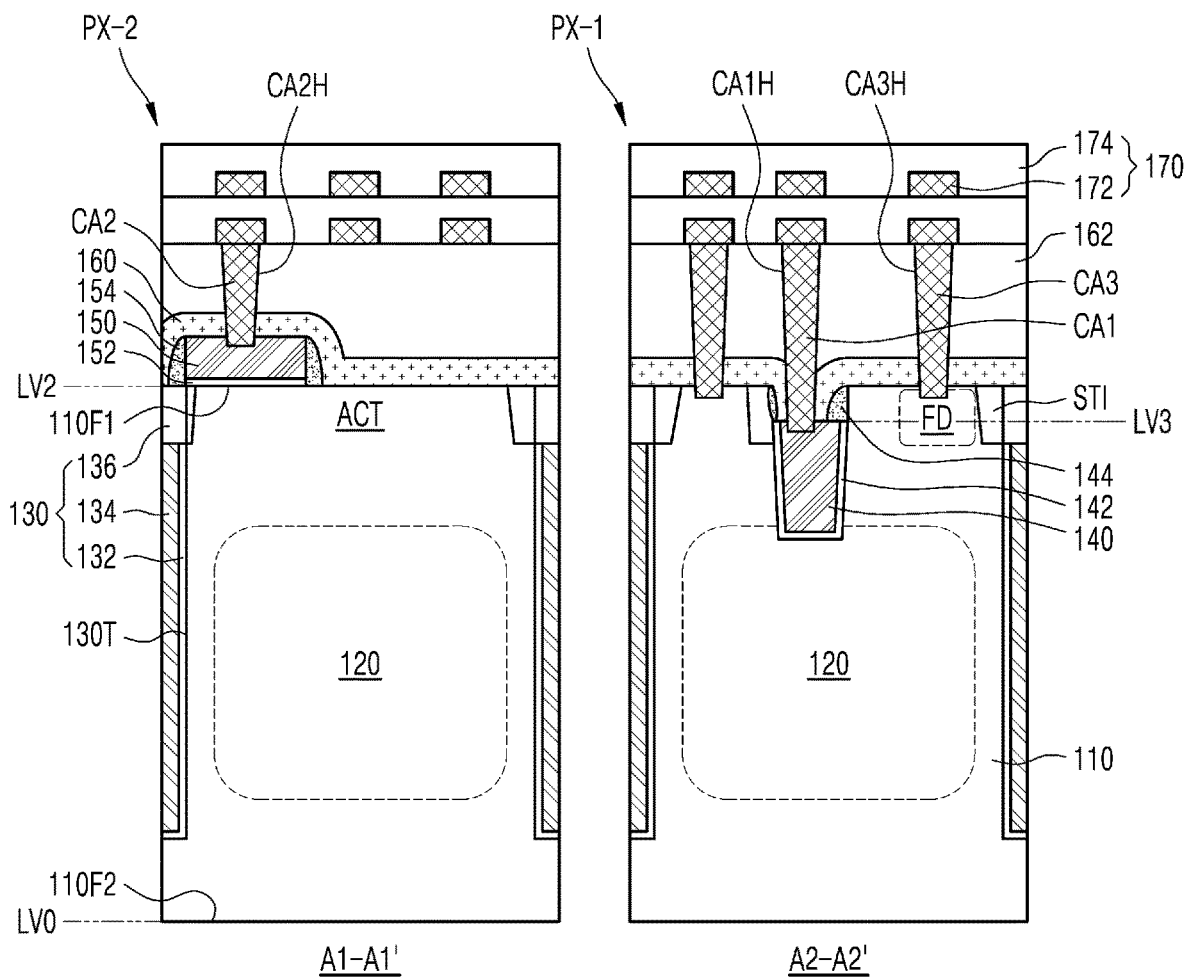

Referring to FIG. 27, a conductive layer filling the first to third contact holes CA1H, CA2H, and CA3H may be formed on the interlayer insulating layer 162, and by planarizing the upper side of the conductive layer so that the upper surface of the interlayer insulating layer 162 is exposed, and thus, a first contact CA1, a second contact CA2, and a third contact CA3 may be respectively formed in the first contact hole CA1H, the second contact hole CA2H, and the third contact hole CA3H.

Thereafter, an upper wiring structure 170 including a wiring layer 172 and an insulating layer 174 may be formed by repeatedly performing operations of forming a conductive layer on the interlayer insulating layer 162, which may include patterning the conductive layer and forming an insulating layer to cover the patterned conductive layer.

Figure 28:
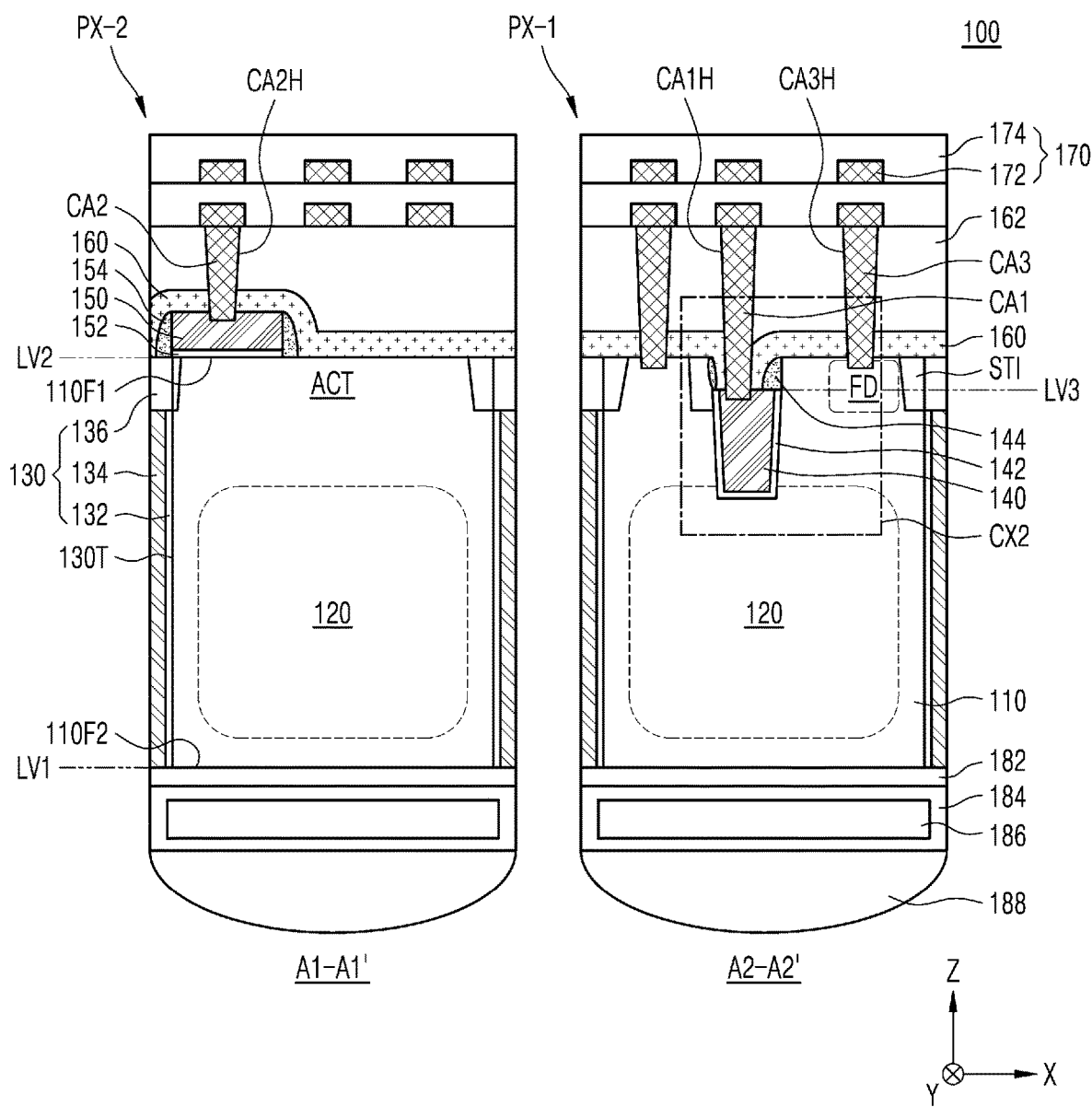

Referring to FIG. 28, a support substrate may be adhered to the first surface 110F1 of the semiconductor substrate 110, and the semiconductor substrate 110 may be turned over such that the second surface 110F2 of the semiconductor substrate 110 faces upward.

Thereafter, a portion of the semiconductor substrate 110 may be removed from the second surface 110F2 of the semiconductor substrate 110 by using a planarization process such as a chemical mechanical polishing (CMP) process or an etch-back process so that the upper surface (e.g., an end adjacent to the second surface 110F2 of the semiconductor substrate 110) of a pixel isolation layer 130 is exposed. As the removal process is performed, a level LV1 of the second surface 110F2 of the semiconductor substrate 110 may be lowered.

Thereafter, a rear insulating layer 182 may be formed on the second surface 110F2 of the semiconductor substrate 110. The rear insulating layer 182 may cover the pixel isolation layer 130 and may be formed on the second surface 110F2 of the semiconductor substrate 110. For example, the rear insulating layer 182 may be formed on the entire area of the second surface 110F2.

Thereafter, a passivation layer 184 may be formed on the rear insulating layer 182, and a color filter 186 and a microlens 188 may be formed on the passivation layer 184.

The image sensor 100 may be completed by the above-described processes.

According to a comparative example, the transfer gate TG has a recess gate shape, in which an upper portion of the transfer gate TG is arranged at a higher level than the first surface 110F1 of the semiconductor substrate 110 and the lower side of the transfer gate TG extends into the inside of the semiconductor substrate 110. In particular, the transfer gate TG and other gates (i.e., a reset gate RG, a selection gate SG, and a source follower gate SF) may be patterned using the same mask pattern, and in the patterning process, a protrusion such as a stringer may remain on a sidewall of the transfer gate TG. Accordingly, a parasitic capacitance between the protrusion of the transfer gate TG and the floating diffusion region FD may increase or a GIDL current may increase, and thus, image quality deterioration factors such as white spots may occur.

However, according to an exemplary embodiment of the present inventive concept, the transfer gate TG may include the buried transfer gate electrode 140, and the buried transfer gate electrode 140 may be formed to have a substantially flat upper surface 140U arranged at a lower level than the first surface 110F1 of the semiconductor substrate 110 by using an etch-back process after the first gate electrode 150 is formed. Accordingly, an increase in parasitic capacitance due to the protrusion, or generation of a GIDL current may be prevented, and the image sensor 100 may have increased image quality.

In addition, in the method of manufacturing an image sensor according to the comparative example, the transfer gate TG and other gates (i.e., the reset gate RG, the selection gate SG, and the source follower gate SF) are patterned using the same mask pattern, that is, the second mask pattern M2, and the transfer gate TG is formed to have, from a horizontal cross-sectional view, a triangular shape rather than a rectangular shape. Accordingly, the second mask pattern M2 corresponding to the transfer gate TG may be easily lifted in the patterning process and the lifting margin of the second mask pattern M2 may be relatively small. However, according to an exemplary embodiment of the present inventive concept, because the buried transfer gate electrode 140 is formed by an etch-back process and the second mask pattern M2 corresponding to the buried transfer gate electrode 140 (or the transfer gate TG) is not formed, a lifting margin in a process of forming the second mask pattern M2 may be improved.

Figure 29:
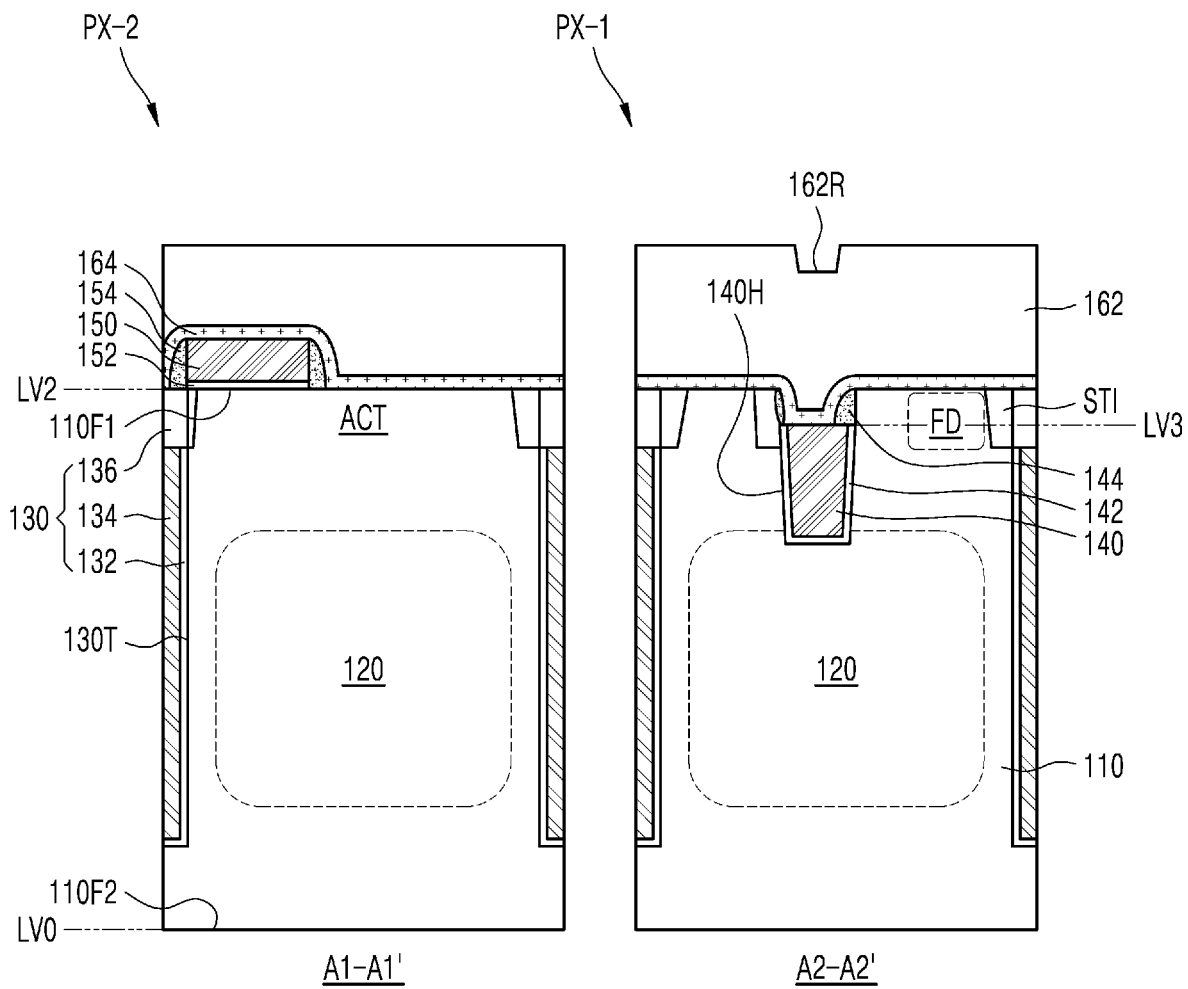
FIG. 29 is a cross-sectional view illustrating a method of manufacturing an image sensor, according to an exemplary embodiment of the present inventive concept.
Figure 29:
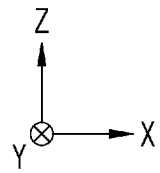

FIG. 29 is a cross-sectional view illustrating a method of manufacturing an image sensor 100A, according to an exemplary embodiment of the present inventive concept.

First, processes as described with reference to FIGS. 13 to 23, according to an exemplary embodiment of the present inventive concept, are performed to form a structure in which a first gate electrode 150, a gate spacer 154, a buried transfer gate electrode 140, and a transfer gate spacer 144 are arranged on a first surface 110F1 of a semiconductor substrate 110.

Referring to FIG. 29, an insulating liner 164 is formed on the first surface 110F1 of the semiconductor substrate 110. The insulating liner 164 may cover an active region ACT, an isolation layer STI, an upper surface of a first gate electrode 150, and a gate spacer 154, and may be arranged on an upper sidewall of a transfer gate trench 140H. The insulating liner 164 may cover the transfer gate spacer 144 and an upper surface of the buried transfer gate electrode 140 but may be formed to have a fourth thickness t22 (refer to FIG. 8) to not completely fill an upper portion of the transfer gate trench 140H.

Thereafter, an interlayer insulating layer 162 may be formed on the insulating liner 164. As the insulating liner 164 does not completely fill the upper portion of the transfer gate trench 140H, the interlayer insulating layer 162 may have a recess region 162R having an upper surface above the transfer gate trench 140H but below the uppermost surface of the interlayer insulating layer.

Thereafter, a process as described with reference to FIG. 25 may be performed to form first to third contact holes CA1H, CA2H, and CA3H. The first contact hole CA1H may be formed by etching a portion of the interlayer insulating layer 162 at a location where the recess region 162R is formed, and accordingly, the first contact hole CA1H, the second contact hole CA2H, and the third contact hole CA3H, which have different heights from one another, may be formed using the same process.

Thereafter, processes as described with reference to FIGS. 26 to 28 may be performed to complete the image sensor 100A.

Figure 30:
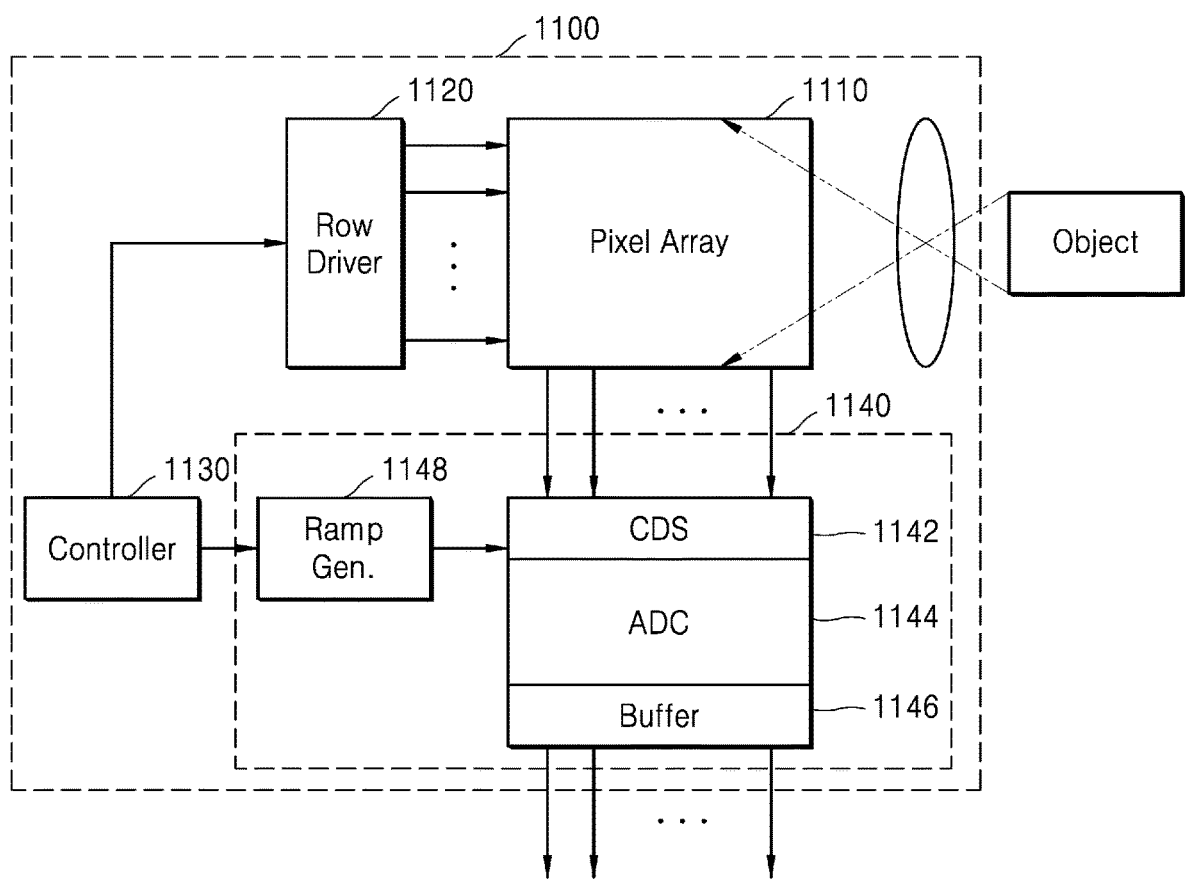
FIG. 30 is a block diagram illustrating a configuration of an image sensor according to an exemplary embodiment of the present inventive concept.

FIG. 30 is a block diagram illustrating a configuration of an image sensor 1100 according to an exemplary embodiment of the present inventive concept.

Referring to FIG. 30, the image sensor 1100 may include a pixel array 1110, a controller 1130, a row driver 1120, and a pixel signal processor 1140. The image sensor 1100 includes at least one of the image sensors 100, 100A, 100B, and 200 described with reference to FIGS. 1 to 12.

The pixel array 1110 may include a plurality of unit pixels arranged in a two-dimensional manner, and each of the unit pixels may include an organic photoelectric conversion element. The organic photoelectric conversion element may absorb light to generate charges, and an electric signal (e.g., an output voltage) according to the generated charges may be provided to the pixel signal processor 1140 through a vertical signal line. The unit pixels included in the pixel array 1110 may provide an output voltage one at a time in row units, and accordingly, unit pixels belonging to one row of the pixel array 1110 may be activated at the same time by a selection signal output by the row driver 1120. Unit pixels belonging to a selected row may provide an output voltage according to absorbed light to an output line of a corresponding column.

The controller 1130 may control the row driver 1120, and accordingly, the pixel array 1110 may absorb light to accumulate charges, temporarily store the accumulated charges, or output an electric signal according to the stored charges to the outside of the pixel array 1110. In addition, the controller 1130 may control the pixel signal processor 1140 to measure an output voltage provided by the pixel array 1110.

The pixel signal processor 1140 may include, for example, a correlated double sampler (CDS) 1142, an analog-to-digital converter (ADC) 1144, and a buffer 1146. The CDS 1142 may sample and hold the output voltage provided by the pixel array 1110. The CDS 1142 may double-sample a certain noise level and a level according to a generated output voltage and output a level corresponding to a difference therebetween. In addition, the CDS 1142 may receive and compare a ramp signal generated by a ramp signal generator 1148 and may output a comparison result.

The ADC 1144 may convert an analog signal corresponding to a level received from the CDS 1142 into a digital signal. The buffer 1146 may latch digital signals, and the latched digital signals may be sequentially output to the outside of the image sensor 1100 and may be transmitted to an image processor.

While the present inventive concept has been described with reference to embodiments thereof, it will be understood by those of ordinary skill in the art that various changes in form and details may be made thereto without departing from the spirit and scope of the present inventive concept.

What is claimed is:

1. An image sensor comprising:
a semiconductor substrate including a first surface and a second surface opposite to each other;
a buried transfer gate electrode arranged in a transfer gate trench extending from the first surface of the semiconductor substrate into the semiconductor substrate, wherein the buried transfer gate electrode has an upper surface arranged at a level lower than that of the first surface of the semiconductor substrate with respect to the second surface of the semiconductor substrate; and
a transfer gate spacer arranged on an upper sidewall of the transfer gate trench and on the buried transfer gate electrode,
wherein the transfer gate spacer includes a first portion and a second portion, wherein the first portion is disposed above a first sidewall of the buried transfer gate electrode and has a first thickness, and wherein the second portion is disposed above a second sidewall of the buried transfer gate electrode and has a second thickness that is different from the first thickness.

2. The image sensor of claim 1, further comprising:
an isolation layer provided on the first surface of the semiconductor substrate and defining an active region,
wherein the first sidewall of the buried transfer gate electrode is at least partially surrounded by the isolation layer, and
the second sidewall of the buried transfer gate electrode is at least partially surrounded by the active region.

3. The image sensor of claim 2, wherein the second thickness is greater than the first thickness.

4. The image sensor of claim 2, further comprising:
a buried insulating layer arranged on the first surface of the semiconductor substrate, the transfer gate spacer, and the buried transfer gate electrode and filling an upper portion of the transfer gate trench; and
a first contact passing through the buried insulating layer and connected to the buried transfer gate electrode.

5. The image sensor of claim 4, further comprising:
a first gate electrode arranged on the first surface of the semiconductor substrate; and
a gate spacer arranged on a sidewall of the first gate electrode,
wherein a material included in the gate spacer is the same as a material included in the transfer gate spacer.

6. The image sensor of claim 5, wherein the buried insulating layer is arranged on the first gate electrode and the gate spacer, and
wherein the image sensor further comprises a second contact passing through the buried insulating layer and connected to the first gate electrode.

7. The image sensor of claim 2, further comprising:
an insulating liner arranged on the first surface of the semiconductor substrate, the transfer gate spacer, and the buried transfer gate electrode, and arranged on an upper sidewall of the transfer gate trench; and
a first contact passing through the insulating liner and connected to the buried transfer gate electrode.

8. The image sensor of claim 7, further comprising:
a first gate electrode arranged on the first surface of the semiconductor substrate, wherein the insulating liner is arranged on the first gate electrode; and
a second contact passing through the insulating liner and connected to the first gate electrode.

9. The image sensor of claim 2, further comprising:
a floating diffusion region inside the semiconductor substrate and arranged adjacent to the first surface of the semiconductor substrate,
wherein the floating diffusion region is spaced apart from the second sidewall of the buried transfer gate electrode, and
wherein, with respect to the second surface of the semiconductor substrate, the upper surface of the buried transfer gate electrode is arranged at a level lower than that of an upper surface of the floating diffusion region.

10. The image sensor of claim 1, wherein the upper surface of the buried transfer gate electrode has a first depth from the first surface of the semiconductor substrate, and
wherein the first depth is in a range of about 5 nanometers to about 200 nanometers.

11. The image sensor of claim 1, further comprising:
a floating diffusion region inside the semiconductor substrate and arranged adjacent to the first surface, wherein the buried transfer gate electrode has an annular shape surrounding the floating diffusion region.

12. The image sensor of claim 11, wherein the transfer gate trench includes a first sidewall and a second sidewall opposite to the first sidewall, and wherein the second sidewall has an annular shape surrounding the floating diffusion region.

13. The image sensor of claim 12, wherein the transfer gate spacer includes a first portion and a second portion, wherein the first portion of the transfer gate spacer is arranged on the first sidewall of the transfer gate trench, and wherein the second portion is arranged on the second sidewall of the transfer gate trench and is spaced apart from the first portion.

14. An image sensor comprising:

a semiconductor substrate including a first surface and a second surface opposite to each other;

an isolation layer provided on the first surface of the semiconductor substrate and defining an active region;

a buried transfer gate electrode arranged in a transfer gate trench extending from the first surface of the semiconductor substrate toward the second surface of the semiconductor substrate;

a transfer gate spacer arranged on an upper sidewall of the transfer gate trench and on the buried transfer gate electrode;

a buried insulating layer arranged on the first surface of the semiconductor substrate, the transfer gate spacer, and the buried transfer gate electrode, and filling an upper portion of the transfer gate trench; and a first contact passing through the buried insulating layer, and connected to the buried transfer gate electrode, wherein the transfer gate spacer includes a first portion and a second portion, wherein the first portion is disposed above a first sidewall of the buried transfer gate electrode and has a first thickness, and wherein the second portion is disposed above a second sidewall of the buried transfer gate electrode and has a second thickness that is different from the first thickness.

15. The image sensor of claim 14, wherein, with respect to the second surface of the semiconductor substrate, an upper surface of the buried transfer gate electrode is arranged at a level lower than that of the first surface of the semiconductor substrate, and wherein a first surface of the transfer gate spacer is arranged at a level higher than that of the upper surface of the buried transfer gate electrode.

16. The image sensor of claim 14, wherein the first sidewall of the buried transfer gate electrode is at least partially surrounded by the isolation layer, and wherein the second sidewall of the buried transfer gate electrode is at least partially surrounded by the active region.

17. The image sensor of claim 16, wherein the second thickness is greater than the first thickness, and wherein the transfer gate spacer has an annular shape.

18. The image sensor of claim 14, further comprising:

a floating diffusion region inside the semiconductor substrate and arranged adjacent to the first surface, wherein, with respect to the second surface of the semiconductor substrate, an upper surface of the buried transfer gate electrode is arranged at a level lower than that of an upper surface of the floating diffusion region.

19. An image sensor comprising:

a first chip and a second chip attached to the first chip, wherein the first chip includes:

a semiconductor substrate including a first surface and a second surface opposite to each other;

an isolation layer provided on the first surface of the semiconductor substrate and defining an active region;

a buried transfer gate electrode arranged in a transfer gate trench extending into the semiconductor substrate;

a transfer gate spacer arranged on a first sidewall of the transfer gate trench and on the buried transfer gate electrode;

a first gate electrode arranged on the first surface of the semiconductor substrate;

a gate spacer arranged on a sidewall of the first gate electrode;

a buried insulating layer arranged on the first surface of the semiconductor substrate, the first gate electrode, and the buried transfer gate electrode, and filling a portion of the transfer gate trench;

an interlayer insulating layer arranged on the buried insulating layer;

a first contact passing through the buried insulating layer and the interlayer insulating layer, and connected to the buried transfer gate electrode; and a second contact passing through the buried insulating layer and the interlayer insulating layer, and connected to the first gate electrode, wherein the transfer gate spacer includes a first portion and a second portion, wherein the first portion is disposed above a first sidewall of the buried transfer gate electrode and has a first thickness, and wherein the second portion is disposed above a second sidewall of the buried transfer gate electrode and has a second thickness that is different from the first thickness.

20. The image sensor of claim 19, wherein the first sidewall is at least partially surrounded by the isolation layer, wherein the second sidewall is at least partially surrounded by the active region, and wherein the image sensor further comprises a floating diffusion region arranged inside the semiconductor substrate and spaced apart from the second sidewall of the buried transfer gate electrode.

* * * * *